United States Patent [19]
Sogabe

[11] Patent Number: 5,812,611
[45] Date of Patent: Sep. 22, 1998

[54] FREQUENCY ESTIMATING CIRCUIT AND AFC CIRCUIT USING THE SAME

[75] Inventor: Yasushi Sogabe, Tokyo, Japan

[73] Assignee: Mitsubishi Denki Kabushiki Kaisha, Tokyo, Japan

[21] Appl. No.: 760,236

[22] Filed: Dec. 5, 1996

[30] Foreign Application Priority Data

Feb. 2, 1996 [JP] Japan .................................. 8-017673

[51] Int. Cl.⁶ .................................................. H04L 27/06
[52] U.S. Cl. ............................ 375/344; 375/326; 327/47
[58] Field of Search ................................... 375/344, 326; 327/113, 47; 331/34; 455/182.1, 182.2, 136, 164, 192.1, 192.9

[56] References Cited

U.S. PATENT DOCUMENTS

| | | | |
|---|---|---|---|
| 5,287,388 | 2/1994 | Ogura et al. | 375/344 |
| 5,291,081 | 3/1994 | Takeuchi et al. | 327/47 |
| 5,428,647 | 6/1995 | Rasky et al. | 375/344 |
| 5,500,878 | 3/1996 | Iwasaki | 375/344 |
| 5,598,441 | 1/1997 | Kroeger et al. | 375/344 |

FOREIGN PATENT DOCUMENTS

0580216A1  7/1994  European Pat. Off. .
0609717A2  8/1994  European Pat. Off. .

OTHER PUBLICATIONS

*Present and Future Perspective in Research and Development of Digital Modem*, Y. Takeuchi et al., IT90–99, pp. 23–30.

Primary Examiner—Stephen Chin
Assistant Examiner—Betsy L. Deppe

[57] ABSTRACT

This invention provides a frequency estimating circuit in which estimating a frequency offset distributed outside the observation range based on the frequency of a received pilot signal degenerated into the observation range. The frequency estimating circuit comprises a time-axis to frequency-axis converter circuit for converting an input data stream constructed of a sampled quantized received pilot signal into a signal on a frequency axis to determine a power spectrum, and an MAX search circuit for searching for the maximum value of the power spectrum to determine the frequency $f_1$ corresponding to the maximum value of the power spectrum, and a frequency computing circuit for computing candidates of a frequency offset distributed outside the observation range baaed on the frequency $f_1$ and for outputting them as frequency information $f_{EST}$.

12 Claims, 24 Drawing Sheets

FIG. 20
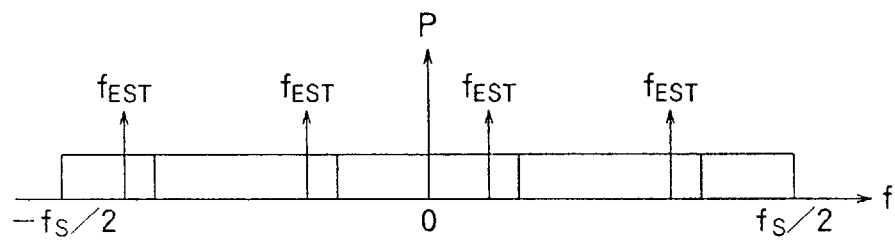
DETERMINE AFRESH POWER SPECTRUMS
FOR THESE FREQUENCIES ONLY
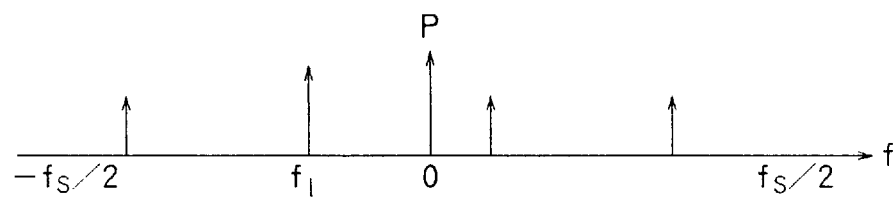

T : SYMBOL PERIOD          $T_S$ : SAMPLING PERIOD
m : OVER-SAMPLE COUNT   L : SAMPLE SYMBOL COUNT
f : =1/T

EXAMPLE OF TRANSFER FUNCTION OF LPF

FREQUENCY ESTIMATING CIRCUIT AND AFC CIRCUIT USING THE SAME

BACKGROUND OF THE INVENTION

1. Field of the Invention

The present invention relates to an automatic frequency control (AFC) for use in a demodulator device that demodulates a received signal in a satellite communication system or satellite mobile communications system.

2. Description of the Related Art

As related initial AFC circuits, a technique of estimating a frequency offset Δf has been proposed based on the characteristic of power spectrum that a frequency corresponding to the frequency offset Δf of a carrier gives a higher power level when power spectrum is derived from a received non-modulated signal.

FIG. 43 shows an example of the organization of a prior art initial AFC circuit, disclosed in TECHNICAL REPORT OF IEICE IT90-99 (1990) entitled [Present and Future Perspective in the Research and Development of Digital Modem] (authored by Takeuchi et al., published Jan. 23, 1991).

There are shown a received signal input 1 quantized and sampled, a low-pass filter (hereinafter referred to as LPF) 8 for removing noise outside the frequency band of the received signal, a multiplier 101 that removes a modulating component by multiplying the received signal that is M-phase PSK modulated, Fast Fourier Transform (hereinafter referred to as FFT) circuit 2 for converting the received signal expressed in the time domain into the frequency domain and for determining the power spectrum of the received signal, an MAX search circuit 3 for searching the maximum value of the power spectrum and determining the frequency having the maximum—value power, a frequency divider 102 for frequency dividing the frequency determined by the MAX search circuit 3, a frequency estimating circuit 103 composed of the multiplier 101, the FFT circuit 2, the MAX search circuit 3 and the frequency divider 102, and a frequency correction block 7 for removing Δf from the received frequency based on the frequency information estimated by the frequency estimating circuit 103.

FIGS. 45A and 45B are diagrams showing on the frequency axis the result that is obtained by subjecting the sampled received signal to discrete Fourier transform (hereinafter referred to as DFT).

The operation of the AFC circuit is now discussed. In the discussion that follows, for convenience of explanation, it is assumed that the modulation scheme is M-phase PSK, and that the received signal is a baseband signal expressed in a complex form. The received signal is a discrete signal that is quantized through A/D conversion.

By allowing the received signal 1 quantized and sampled at a sampling period of $T_s$ to pass through LPF 8, out-of-band noise is removed. The signal without the out-of-band noise is M-multiplied by the multiplier 101. M-multiplication removes the modulating component even further and the signal becomes a non-modulated signal.

The signal without noise and modulating component is converted from a time-domain signal into a frequency-domain signal in the FFT circuit 2. By squaring the frequency-domain converted signal, power spectrum of the received signal is obtained. The FFT circuit 2 outputs power spectrum within a frequency range determined by the sampling period $T_s$. Since the FFT circuit 2 performs FFT to the quantized and discrete signal to derive power spectrum of the received signal, power spectrum of the received signal is also a discrete signal.

Since the received signal that is time-domain to frequency-domain converted is a non-modulated signal as described above, its power spectrum exhibits a peak at a frequency correlated with the frequency offset Δf as shown in FIG. 44. Hence Δf can be estimated by determining the frequency of spectrum that gives a maximum power spectrum. The MAX search circuit 3 searches for a maximum value of the power spectrum in the power spectrum that is time-domain to frequency domain converted by the FFT circuit 2, and determines the frequency corresponding to the maximum-value spectrum.

It should be noted, however, that since the frequency determined by the FFT 2 is already M-multiplied by the multiplier 101, the frequency actually observed is M times the frequency offset Δf. Hence to determine the actual frequency offset Δf, the frequency from the FFT 2 is M-frequency divided by the frequency divider 102, and thus the actual frequency offset Δf is obtained. Frequency correction of the received signal is performed based on the frequency information estimated by the frequency correction block 7.

Referring to FIGS. 45A and FIG. 45B, DFT is now discussed. FIG. 45A is a diagram showing the sampled received signal. In the sampling of the received signal, the received signal is typically over-sampled at a symbol rate T times m in view of demodulation. FIG. 45B is a diagram showing the signal into which the FFT circuit 2 time-domain to frequency-domain converts a data stream for L symbols that are over-sampled by m times. Frequency range and frequency intervals observable are determined by the Nyquist theorem as follows.

| Frequency range: | $-f_s/2 \sim f_s/2$ | (1) |
|---|---|---|
| | $(f_s = 1/T_s = m/T)$ | |
| Frequency interval: | $1/(L \cdot T)$ | |

T: Symbol period
$T_s$: Sampling period
m: Over-sample count
L: Symbol count

The over-sample count and the symbol count to be processed are conventionally set with a view to the frequency range and frequency interval the entire system requires.

FIG. 46 is a diagram illustrating aliasing characteristic of FFT when the received signal is sampled at a sampling period of $T_s$. Aliasing periodically takes place every $f_s$, and when the received signal is subjected to DFT, out-of-range components are added (aliasing noise is added) within the observable frequency range of $-f_s/2 \sim f_s/2$. To remove signals outside the observable frequency range, the received frequency is passed through LPF 8 having a transfer function as shown in FIG. 47 prior to being applied to the frequency estimating circuit 103 as shown in FIG. 43. The transfer function of LPF 8 is designed to remove the components outside the observable frequency range.

SUMMARY OF THE INVENTION

As described above, since the symbol period T is constant, from equation (1) the symbol count L must be increased to enhance estimating accuracy in frequency estimation, and the over-sample count m must be increased to widen the frequency range. Hence to get a high-accuracy and wide operational range AFC, the amount of data increases, and computational load increases accordingly. Depending on types of devices in use, the AFC suffers a limit in process capability, and fails to meet specified requirements, and further, if the frequency offset Δf is outside the observable range, no frequency estimation is possible.

The present invention has been developed to resolve the above problems, and it is an object of the present invention to provide a frequency estimating circuit that features a high accuracy level and a wide operational range with a small amount of computation involved, with a view to aliasing characteristic of DFT. It is another object to provide a frequency estimating circuit that features a high accuracy level and a wide operational range with a smaller amount of computation involved, by decimating the sample value signal in the process of DFT.

It is yet another object of the present invention to provide an AFC circuit that features a high accuracy level and a wide operational range using these estimating circuits.

For achieving the aforementioned object, the present invention provides a frequency estimating circuit comprising: a frequency detector circuit comprising a time-axis to frequency-axis converter circuit for converting an input data stream that is obtained by sampling a received signal on a time axis into a power spectrum on a frequency axis, and a MAX search circuit for searching, in the observation frequency range determined by a sampling frequency, for the frequency corresponding to the maximum value of the power spectrum, and a frequency computing circuit for estimating the frequency offset of the carrier of the received signal through computation based on the frequency determined by the frequency detector circuit and for outputting frequency information.

Further, the frequency detector circuit comprises a plurality of the time-axis to frequency-axis converter circuits for converting a plurality of input data streams that are obtained by sampling the received signal at a plurality of different sampling rates into power spectrums on a frequency axis in accordance with the respective input data streams, and a plurality of the MAX search circuits corresponding to the plurality of the time-axis to frequency-axis converter circuits, for determining the frequencies corresponding to the maximum values of the power spectrums converted by the respective time-axis to frequency-axis converter circuits, whereby the frequency computing circuit estimates the frequency offset of the carrier of the received signal through computation based on the frequencies determined by the frequency detector circuit and for outputting frequency information.

Further, the present invention provides a frequency estimating circuit further comprising a plurality of filter means having transfer functions that allow a signal within the observation frequency range to pass therethrough, whereby the plurality of the time-axis to frequency-axis converter circuits perform time-axis to frequency-axis conversion to the data streams that have passed through the filter means.

Further, the present invention provides a frequency estimating circuit further comprising a time difference circuit for introducing a time difference between the plurality of input data streams that are obtained by sampling the received signal at the plurality of different sampling rates, whereby the time-axis to frequency-axis converter circuits perform time-axis to frequency-axis conversion to the plurality of input data streams after the time difference is introduced by the time difference circuit.

Further, the present invention provides a frequency estimating circuit further comprising a decimating circuit for producing a new data stream by decimating the input data stream at predetermined intervals of a (an integer) samples, whereby the time-axis to frequency-axis converter circuit converts the output data stream output by the decimating circuit into a power spectrum on a frequency axis, a decimating and frequency detector circuit is constituted by the decimating circuit, the time-axis to frequency-axis converter circuit, and the MAX search circuit, and the frequency computing circuit estimates the frequency offset of the carrier of the received signal through computation based on the frequency determined by the MAX search circuit in the decimating and frequency detector circuit and outputs frequency information.

Further, the present invention provides a frequency estimating circuit further comprising a plurality of the decimating and frequency detector circuits for performing time-axis to frequency-axis conversion to new data streams that are produced by decimating the input data stream at different intervals in order to determine power spectrums and for determining frequencies corresponding to the maximum values of the power spectrums, whereby the frequency computing circuit estimates the frequency offset of the carrier of the received signal through computation based on the frequencies determined by the decimating and frequency detector circuits and outputs frequency information.

Further, the present invention provides a frequency estimating circuit further comprising a second decimating and frequency detector circuit comprising a second decimating circuit for producing a new data stream by decimating the input data stream at predetermined intervals of a (an integer) samples, a second time-axis to frequency-axis converter circuit for time-axis to frequency-axis converting the new data stream into a power spectrum on a frequency axis, and a second MAX search circuit for searching the maximum value of the power spectrum determined by the second time-axis to frequency-axis converter circuit and determining the frequency corresponding to the maximum value, and a second frequency computing circuit for estimating the frequency offset of the carrier of the received signal through computation based on the frequency determined by the second decimating and frequency detector circuit and for outputting frequency information, whereby the time-axis to frequency-axis converter circuit in the frequency detector circuit performs time-axis to frequency-axis conversion to the input data stream and determines the power spectrum of frequency corresponding to the frequency information from the second frequency computing circuit.

Further, the present invention provides a frequency estimating circuit further comprising a third decimating circuit for producing a new data spectrum by extracting data from an input data stream so that a resulting sample count of the new data stream is 1/b (b is a natural number) times the sample count of the input data stream, whereby the time-axis to frequency-axis converter circuit in the frequency detector circuit performs time-axis to frequency-axis conversion to the input data stream produced by the third decimating circuit, into a power spectrum on a frequency axis.

Further, the present invention provides a frequency estimating circuit further comprising a fourth decimating circuit for producing a new data stream by extracting data from an input data stream so that a resulting sample count of the new data stream is 1/b (b is a natural number) times the sample count of the input data stream, and a second frequency detector circuit comprising a third time-axis to frequency-axis converter circuit for time-axis to frequency-axis converting the new data stream produced by the fourth decimating circuit into a power spectrum on a frequency axis, and a third MAX search circuit for searching the maximum value of the power spectrum determined by the third time-axis to frequency-axis converter circuit and for determining the frequency corresponding to the maximum value, whereby the time-axis to frequency-axis converter circuit performs time-axis to frequency-axis conversion to the input data stream into a power spectrum on a frequency axis having the frequency in the vicinity of the frequency information determined by the third MAX search circuit in the frequency detector circuit.

Further, the present invention provides a frequency estimating circuit further comprising a plurality of the second decimating and frequency detector circuits which produce new different data streams by decimating the input data stream at different intervals, time-axis to frequency-axis convert the new different data streams to determine power spectrums, search maximum values of the power spectrums and determine the frequencies corresponding to the maximum values, whereby the second frequency computing circuit estimates the frequency offset of the carrier through computation based on the frequencies determined by the plurality of the decimating and frequency detector circuits and outputs frequency information.

Further, the frequency detector circuit further comprises a frequency interpolation circuit for interpolating the frequency output by the MAX search circuit.

Furthermore, the present invention provides an AFC circuit comprising a frequency detector circuit comprising a time-axis to frequency-axis converter circuit for converting an input data stream that is obtained by sampling a received signal on a time axis into a power spectrum on a frequency axis, and a MAX search circuit for searching, in the observation frequency range determined by a sampling frequency, for the frequency corresponding to the maximum value of the power spectrum, a frequency computing circuit for estimating the frequency offset of the carrier of the received signal through computation based on the frequency determined by the frequency detector circuit and for outputting frequency information, and a frequency correction block for producing a plurality of demodulated data streams by removing the frequency offset f from the received signal based on a plurality pieces of frequency information output from the frequency computing circuit and a determining circuit for determining frequency synchronization using the plurality of demodulated data streams output from the frequency correction block.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 20 is a diagram showing the operation of the frequency estimating circuit in the embodiment 9 of the present invention;

DESCRIPTION OF THE PREFERRED EMBODIMENTS

Embodiment 1.

Figure 43:
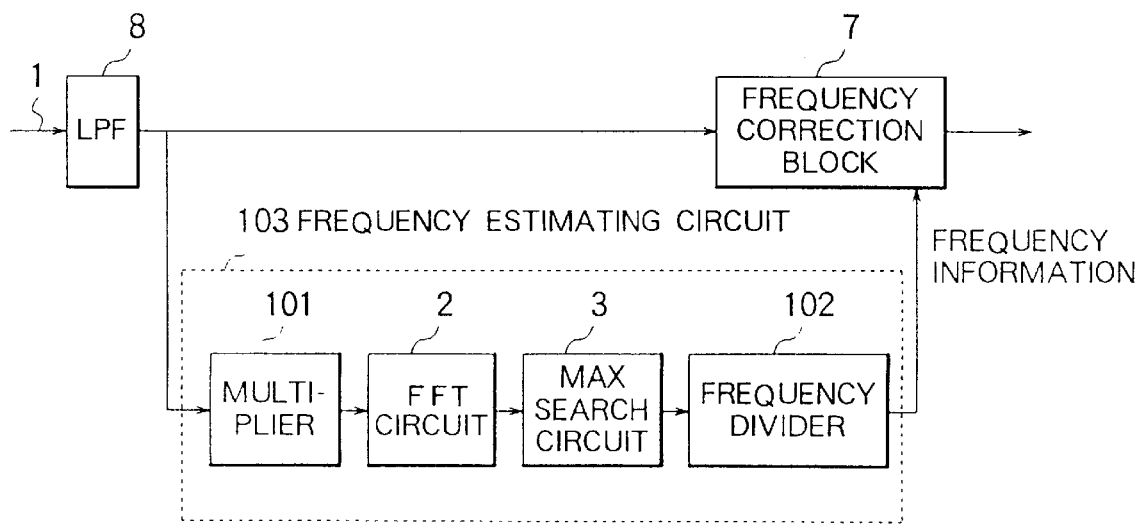
FIG. 43 is a block diagram of the prior art AFC circuit.
Figure 44:
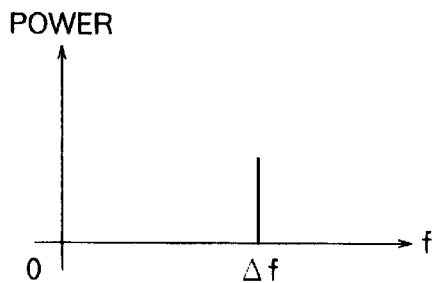
FIG. 44 is a diagram showing the power spectrum of non-modulated signal.
Figure 45A:
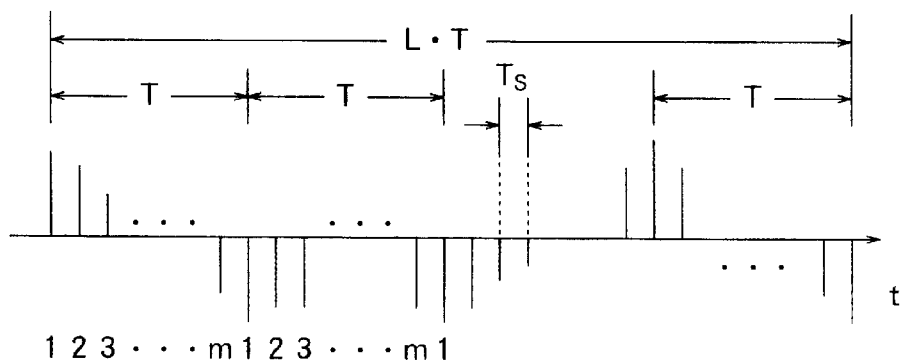
FIGS. 45A and 45B are diagrams showing the DFT result of the sampled received signal.
Figure 45B:
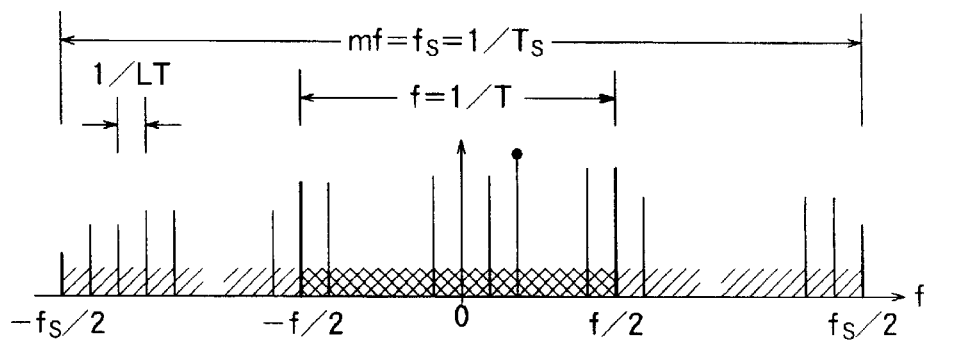
Figure 46:
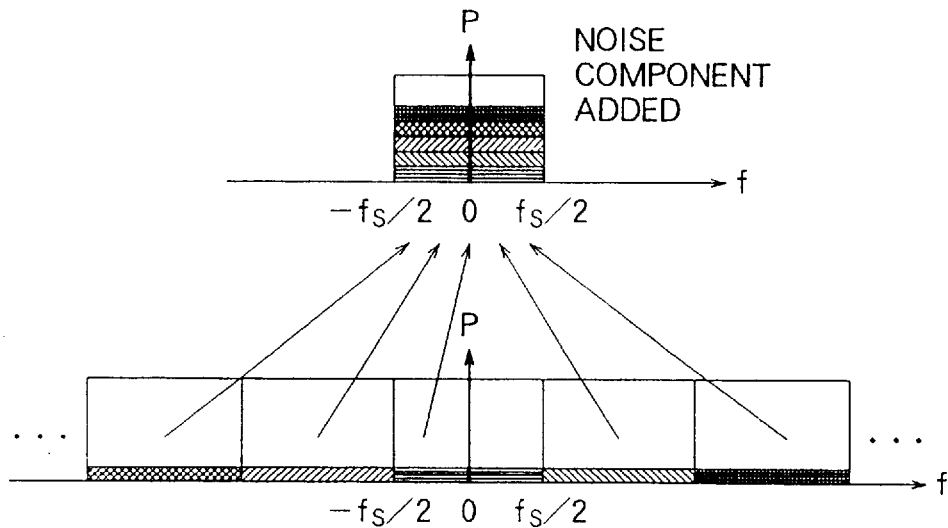
FIG. 46 is a diagram showing aliasing in Fourier transform.
Figure 47:
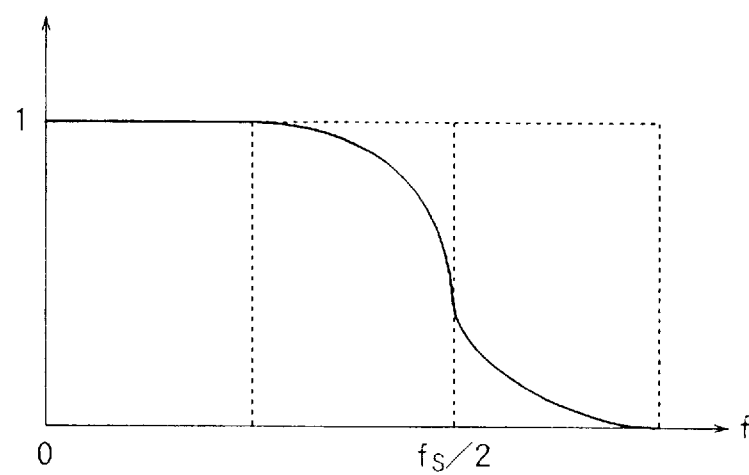
FIG. 47 is a diagram showing one example of transfer function.

One embodiment of the present invention is now discussed. In the prior art, the received signal is an M-phase PSK modulated signal. When the received signal is a modulated signal, the multiplier for removing the modulating component and the frequency divider for dividing the estimated frequency are required as shown in FIG. 43, but whether or not these components exist does not change the discussion that follows.

In the following discussion, for simplicity of explanation, it is assumed that the received signal is a non-modulated pilot signal. For a modulated signal, the multiplier and the frequency divider are used as shown in FIG. 43. In the following embodiments, to convert the received sampled signal from the time domain to the frequency domain, DFT is used, as an example. Let $f_{EST}$ represent frequency information that serves as a candidate for the estimated frequency offset (hereinafter referred to as $\Delta f$) of the carrier finally output by the frequency estimating circuit. Furthermore, the distribution range of $\Delta f$ is $$f_L \leq \Delta \leq f_U$$

Figure 1:
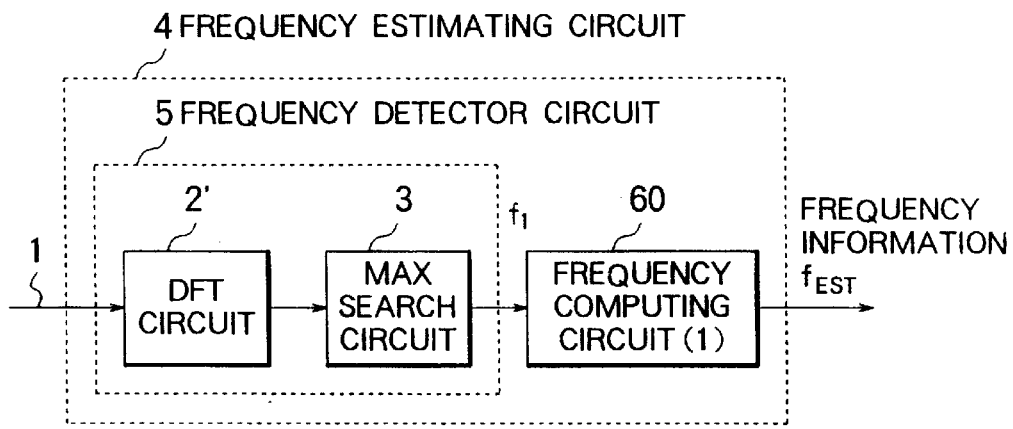
FIG. 1 is a block diagram showing the frequency estimating circuit of the embodiment 1 of the present invention.
Figure 3:
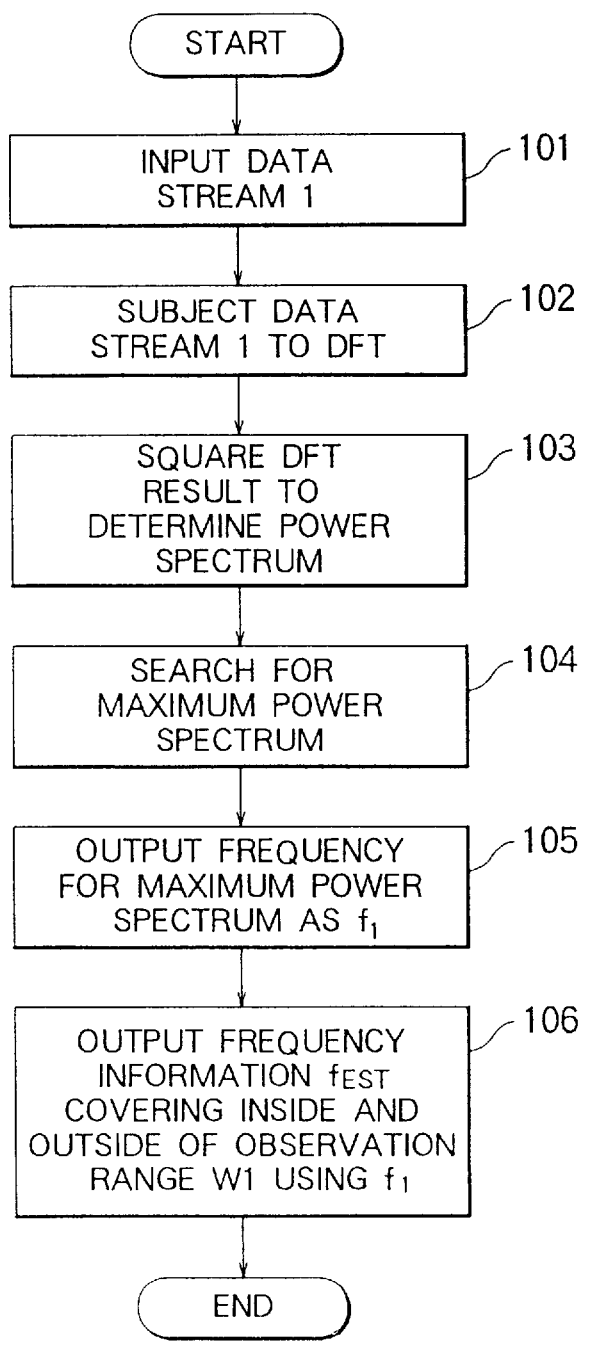
FIG. 3 is a block diagram showing the operation of the frequency estimating circuit according to the embodiment 1 of the present invention.

$f_L$: Lower limit of the distribution range of $\Delta f$
$f_U$: Upper limit of the distribution range of $\Delta f$ FIG. 1 is a block diagram showing the frequency estimating circuit that applies when $\Delta f$ is not necessarily within an observable range W1. FIG. 3 is a flow diagram of the operation of the frequency estimating circuit 4.

There are shown a quantized and sampled input signal 1 (sample value signal), a DFT circuit 2' for converting the received signal expressed in the time domain into the frequency domain and for determining the power spectrum of the received signal, an MAX search circuit 3 for searching the maximum value of the power spectrum and for determining the frequency giving the maximum value of the spectrum, a frequency detector circuit 5 composed of the DFT circuit 2' and the MAX search circuit 3, a frequency computing circuit (1) 60 for estimating the frequency that is a candidate for $\Delta f$ in view of aliasing based on frequency information $f_1$ determined by the frequency detector circuit 5, and a frequency estimating circuit 4 comprising the frequency computing circuit (1) 60 and the frequency detector circuit 5.

Figure 2A:
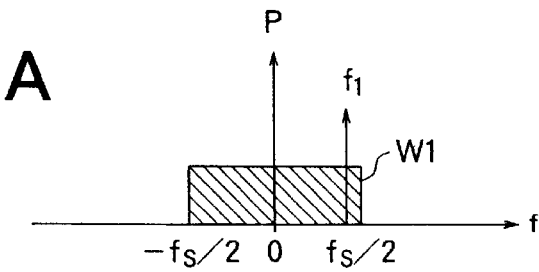
FIGS. 2A and 2B are diagrams showing the operation of the frequency estimation in consideration of aliasing.
Figure 2B:
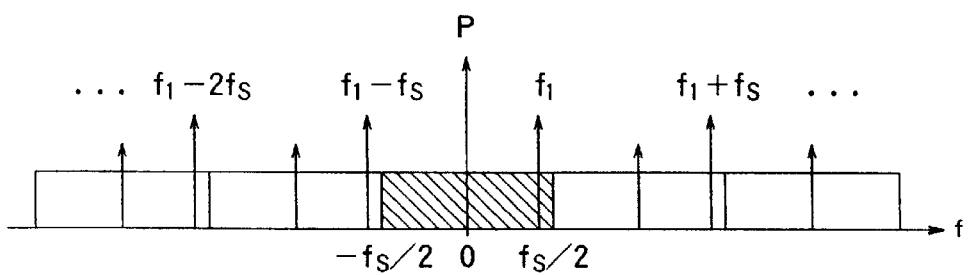

The operation of the frequency estimating circuit is now discussed referring to FIGS. 2A and 2B and FIG. 3. Now, suppose that $\Delta f$ falls not necessarily within the observation range. The DFT circuit 2' converts the sampled received data stream 1 from time-axis signal to a discrete signal on a frequency axis (step 102), and derives a power spectrum by squaring the converted discrete signal (step 103).

The power spectrum output by the DFT circuit 2' is fed to the MAX search circuit 3. The MAX search circuit 3 searches for the maximum value of the input power spectrum in power level within the observation range W1 ($-f_s/2$ to $+f_s/2$ in FIG. 2A) (step 104), and determines and outputs the frequency $f_1$ of the spectrum resulting in the maximum value of the power spectrum (step 105).

The frequency computing circuit 60 carries out the following computation to the frequency $f_1$ determined by the MAX search circuit 3, and outputs an estimate value $f_{EST}$ for $\Delta f$ (step 106).

$$f_{EST} = f_1 + m \cdot f_s \tag{2}$$

m: an integer that meets $f_L \leq (f_1 + m \cdot f_s) \leq f_U$

The frequency computing circuit 60 outputs a plurality of frequency information $f_{EST}$ based on the equation (2). Although $f_{EST}$ estimated as a candidate for the frequency offset is a single in nature, the frequency computing circuit 60 is unable to determine m in the equation (2), and thus estimates and outputs a plurality of candidate frequencies ($f_1-2f_s$, $f_1-f_s$, $f_1$, $f_1+f_s$, etc in FIG. 2B).

Embodiment 2.

Figure 4:
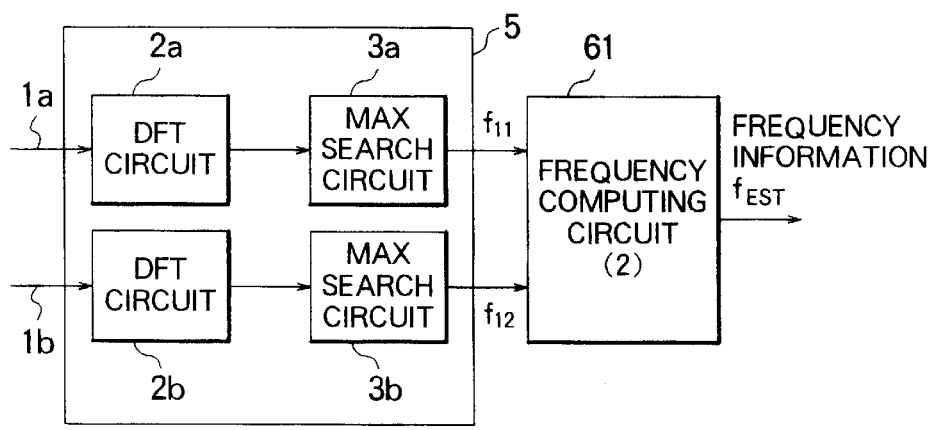
FIG. 4 is a block diagram of the frequency estimating circuit showing the embodiment 2 of the present invention.

FIG. 4 is a block diagram showing an estimating circuit for two input systems of data streams in which the received signal is sampled at different sampling rates. As shown, designated 61 is a frequency computing circuit (2) for estimating $\Delta f$ based on two pieces of frequency information estimated, and DFT circuits 2a, 2b and MAX search circuits 3a, 3b are identical to those described in connection with the embodiment 1, designated 5 is a frequency detector circuit comprising DFT circuits 2a, 2b and MAX search circuits 3a, 3b.

Figure 5:
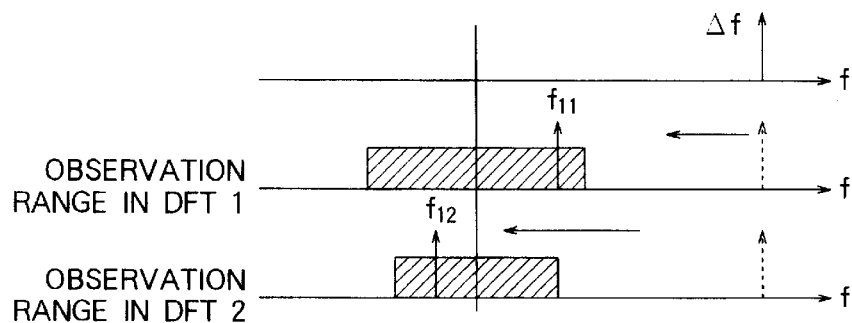
FIG. 5 is a diagram showing the operation of the embodiment 2 of the present invention.

The operation of the frequency estimating circuit is now discussed referring to FIG. 4 and FIG. 5. Let $f_{S1}$ and $f_{S2}$ represent two sampling rates used in producing data streams from the received signal, and let DFT 1 and DFT 2 represent the respective results that are obtained when DFT circuits 2a, 2b perform DFT to two input data streams 1a, 1b sampled.

FIG. 5 shows the resulting DFT, in which $\Delta f$ is shown as degenerated $f_{11}$ within the observable range determined by the sampling rate $f_{S1}$ and $\Delta f$ is shown as degenerated $f_{12}$ within the observable range determined by the sampling rate $f_{S2}$. The MAX search circuits 3a, 3b detect maximum power spectrums within the observable ranges and then outputs their frequencies as $f_{11}$, $f_{12}$.

$\Delta f$ is estimated from each of the detected frequencies $f_{11}$, $f_{12}$ with a view to aliasing as follows.

$$f_{EST}=f_{11}+n_1 \cdot f_{S1} \tag{3}$$

$$f_{EST}=f_{12}+n_2 \cdot f_{S2} \tag{4}$$

$n_1$, $n_2$: integers, each satisfying $f_L \leq (f_{11}+n_1 \cdot f_{S1}, f_{12}+n_2 \cdot f_{S2}) \leq f_U$ Therefore, the frequency computing circuit (2) 61 determines $f_{EST}$ by solving equation (5) using the frequency information $f_{11}$ and $f_{12}$ output from the MAX search circuits 3a, 3b.

$$f_{11}+n_1 \cdot f_{S1} \approx f_{12}+n_2 \cdot f_{S2} \tag{5}$$

Here again in the same way as in the embodiment 1, the frequency estimating circuit is unable to determine sole $n_1$, $n_2$, and thus outputs a plurality of candidates.

Embodiment 3.

Figure 6:
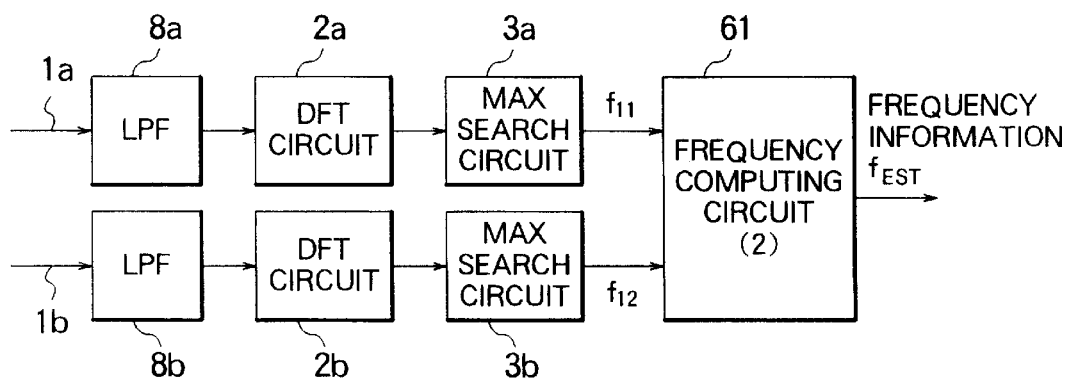
FIG. 6 is a block diagram of the frequency estimating circuit showing the embodiment 3 of the present invention.

FIG. 6 is a block diagram showing a frequency estimating circuit having two input systems, in which the distribution range of $\Delta f$ is approximately known, and LPFs are used to cut off components outside the distribution range of $\Delta f$. As shown, designated 8a and 8b are LPFs having a transfer function that allows signals within a desired observation range to pass therethrough, and input signals 1a, 1b, a frequency detector circuit 5 comprising DFT circuits 2a, 2b and MAX search circuits 3a, 3b and a frequency computing circuit (2) 61 are identical to those described in connection with the embodiment 2.

The operation of the frequency estimating circuit is now discussed. In the same way as in the embodiment 2, $\Delta f$ is sought within the observable range, and the distribution range of $\Delta f$ is within the pass bandwidth of the LPF, and the condition of $n_1$, $n_2$ in equations (3) and (4) is as follows.

$n_1$, $n_2$: integers, each satisfying ($|f_{EST}| \leq$ pass bandwidth of LPF)

Therefore, the frequency computing circuit (2) 61 determines $n_1$, $n_2$ that satisfy this condition, estimates $\Delta f$, and outputs an estimate value as the frequency information $f_{EST}$.

The two LPFs 8a, 8b may have different pass bandwidths.

Embodiment 4.

Figure 7:
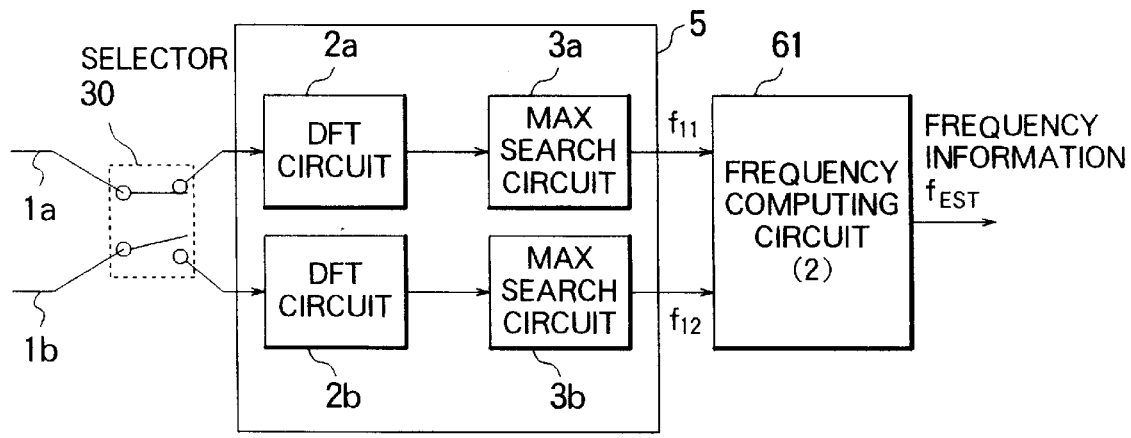
FIG. 7 is a block diagram of the frequency estimating circuit showing the embodiment 4 of the present invention.

FIG. 7 is a block diagram showing an estimating circuit which estimates frequency by introducing a time difference between two input systems. In this case, discussed herein is an example of a selector 30 as a time difference circuit is incorporated in a frequency estimating circuit of the embodiment 2.

Figure 8:
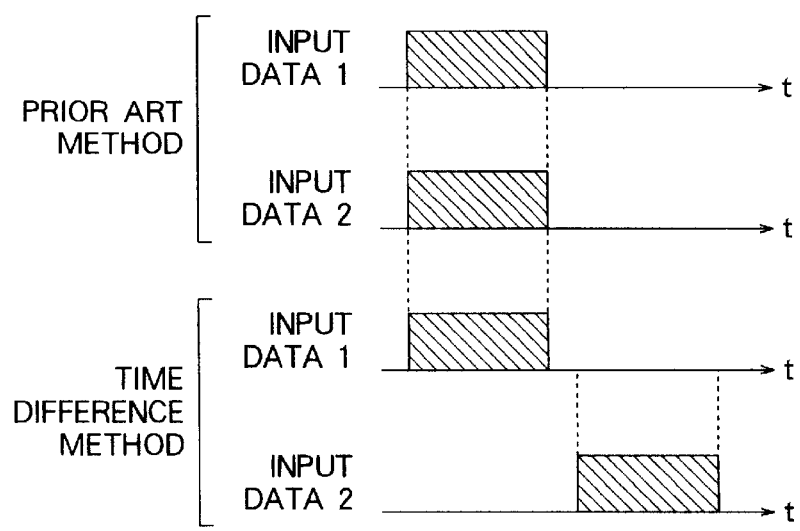
FIG. 8 is a diagram showing an example in which a time-difference is introduced in decimation.
Figure 9:
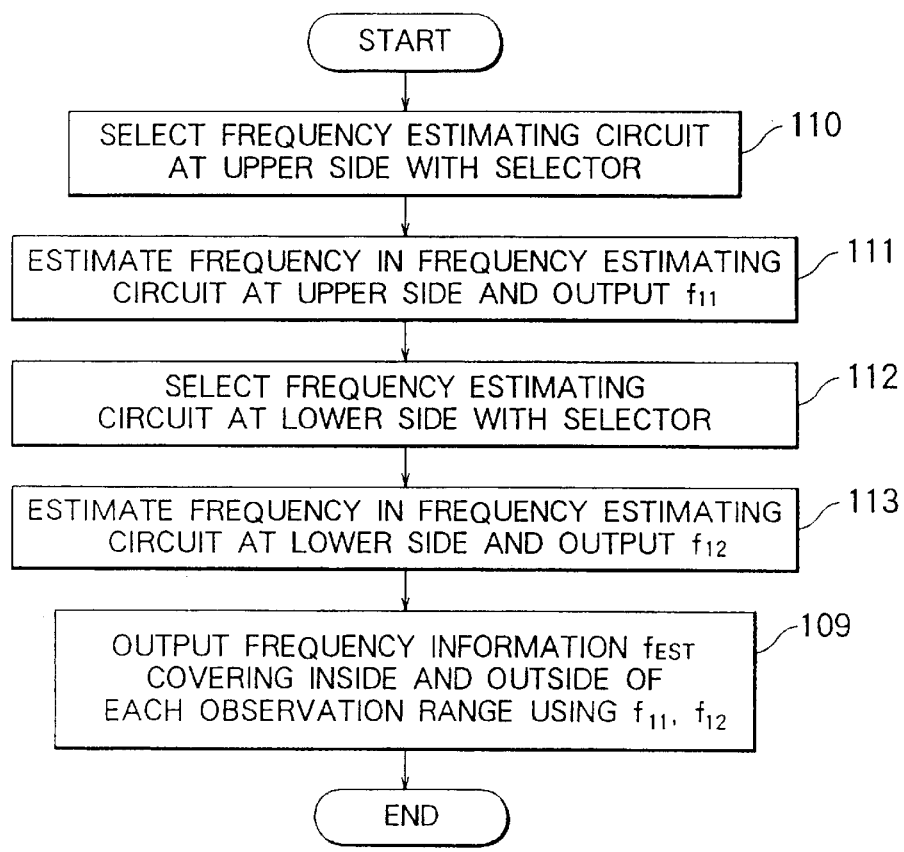
FIG. 9 is a flow diagram showing the operation of the frequency estimating circuit in the embodiment 4 of the present invention.

FIG. 8 is a diagram illustrating the operation of the circuit with a time difference introduced between two input systems, and FIG. 9 is a flow diagram showing the operation. Referring to FIG. 7, designated 30 is the selector included to introduce the time difference between the two input systems, and the frequency detector circuit 5 and the frequency computing circuit (2) 61 remain identical to those described in connection with the embodiment 2.

The operation of the frequency estimating circuit is discussed referring to FIG. 8 to FIG. 9. Although, in the embodiments 2 and 3, the received signal is sampled at different sampling rates, both data processed by the DFT circuit 2'a and the MAX search circuit 3a and data processed by the DFT circuit 2'b and the MAX search circuit 3b are originated at the same time. If $\Delta f$ is not time variant, and not varying while data is sampled, a time difference may be introduced between two input data streams.

The selector 30 selects the DFT circuit 2'a and MAX search circuit 3a (step 110), and $f_{11}$ is derived from a data stream 1a (step 111).

The selector 30 then selects the DFT circuit 2'b and MAX search circuit 3b (step 112), and $f_{12}$ is derived from a data stream 1b (step 113). FIG. 8 shows one example, in which a time difference is introduced in decimation of input data streams to the DFT circuits in this embodiment.

By introducing the time difference between the input data streams, noise correlation between the two input data streams is smaller than the correlation that is derived from the same received signal, the influence of noise is reduced, erroneous detection is reduced, and estimation of $\Delta f$ is improved.

Embodiment 5.

Figure 10:
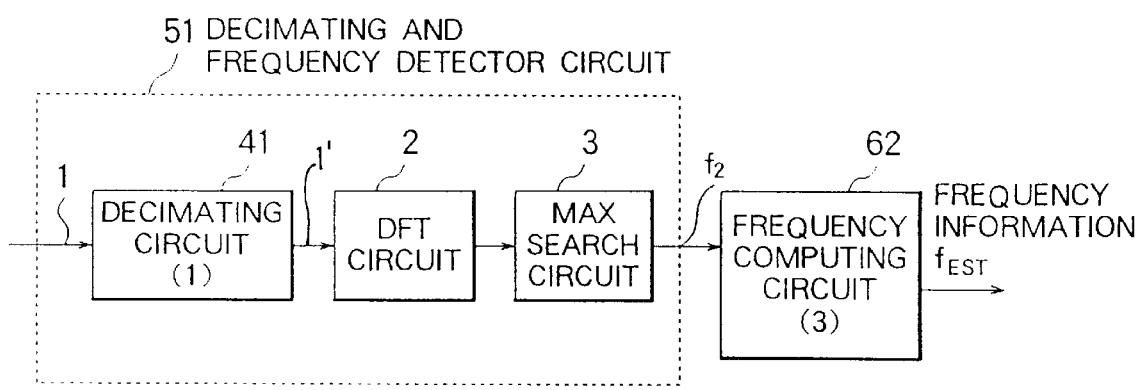
FIG. 10 is a block diagram of the frequency estimating circuit showing the embodiment 5 of the present invention.

FIG. 10 is a block diagram showing a frequency estimating circuit that produces a new data stream by extracting data at regular intervals from a quantized and sampled data stream and thus estimates frequency. Designated 41 is a decimating circuit. The decimating circuit 41 extracts data, at regular intervals of a samples from a sample count N in the input data stream 1, and produces a new data stream 1'. Herein, "a" is a factor of the sample count N. The rest of the organization of this embodiment is identical to that of the preceding embodiments.

The organization constructed of the decimating circuit 41, DFT circuit 2' and MAX search circuit is referred to as a decimating and frequency detector circuit 51.

Figure 11:
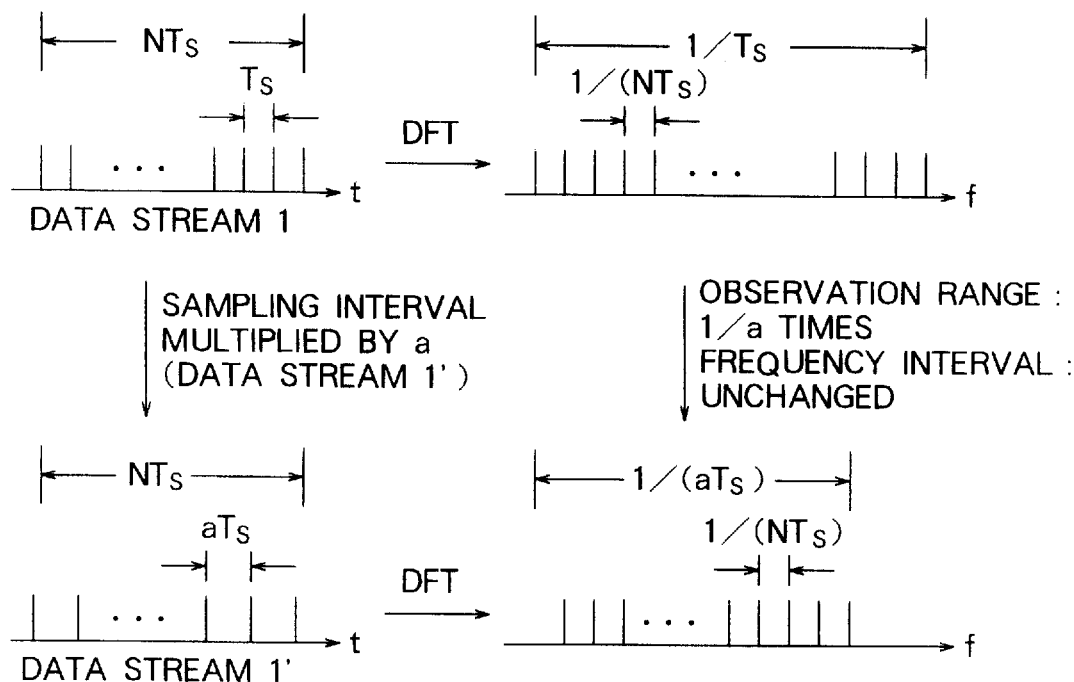
FIG. 11 is a comparison diagram comparing the DFT results derived from the data stream 1 and the data stream 2.
Figure 12:
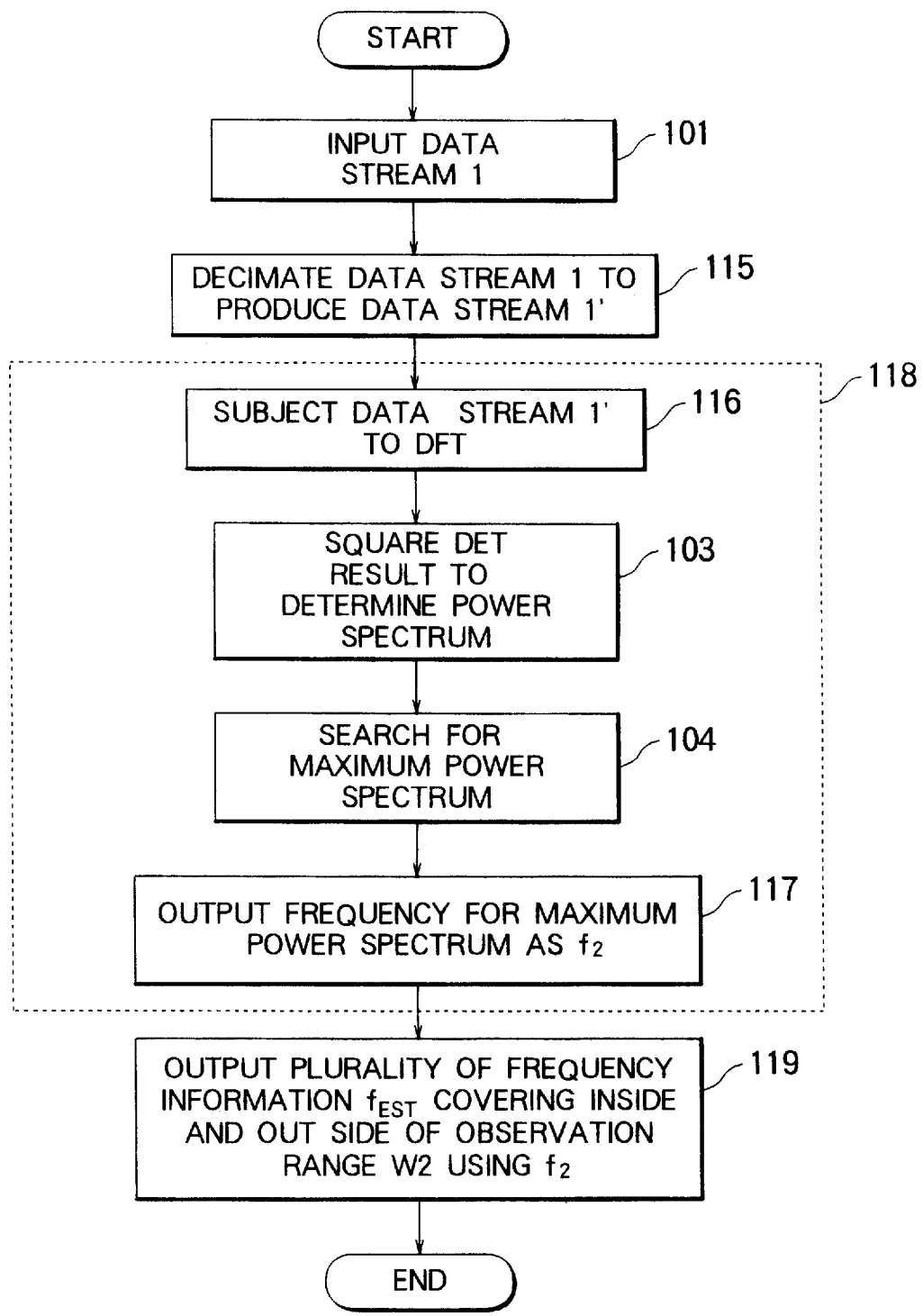
FIG. 12 is a flow diagram showing the operation of the frequency estimating circuit in the embodiment 5 of the present invention.

The operation of the frequency estimating circuit is discussed referring to FIG. 11 and FIG. 12.

The decimating circuit (1) 41 extracts data at regular intervals of a samples from the sample count N in the data stream 1 that is sampled at a sampling period $T_s$, thereby producing a new data stream 1' having a sampling period of $aT_s$ (step 115).

The DFT circuit 2' converts the new data stream 1' from time-axis signal to frequency-axis signal (step 116), and squares the frequency-axis signal to derive a power spectrum (step 103). The MAX search circuit 3 searches for the power spectrum having a maximum level and determines the frequency $f_2$ of the maximum power spectrum (step 117).

Collectively, steps 116, 103, 104, and 117 may be referred to as step 118 as shown in FIG. 12 which subjects the data stream 1' to time-axis to frequency axis conversion and outputs a frequency for maximum power spectrum as $f_2$. Thereafter, the frequency computing circuit (3) 62 receives $f_2$ and outputs a plurality of frequency information $f_{EST}$ covering inside and outside a observation range W2.

FIG. 11 shows two cases: in one case, the new data stream 1' is produced by extracting data on a per a samples basis from the data stream 1 and is then subjected to DFT, and in the other case, the data stream 1 is directly subjected to DFT.

Now consider N samples in the data stream 1 sampled at a sampling period $T_s$. Data is extracted on a per a samples basis (a is a factor of N) from the data stream 1 to produce the data stream 1' having a sampling period equal to the original sampling period times a, the data stream 1' is time-axis to frequency-axis converted, and the result is compared with the result derived from the data stream 1 that is directly time-axis to frequency axis converted, showing that the observation range for the data stream 1' is 1/a times the observation range for the data stream 1. The frequency interval from the frequency axis converted data stream 1' remains identical to that from the frequency-axis converted data stream 1.

Figure 13:
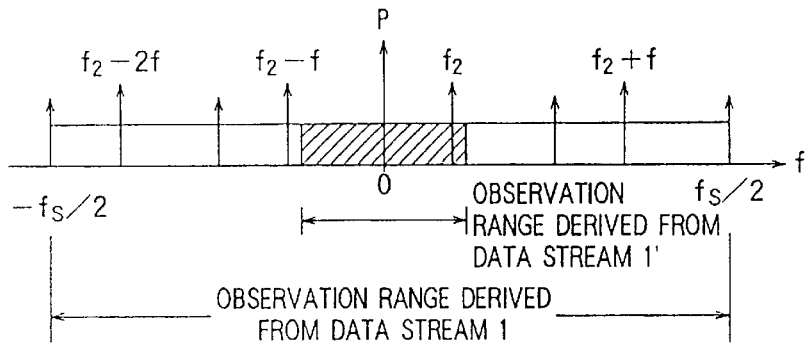
FIG. 13 is a diagram showing the method of frequency estimation that is performed within the observation range of the data stream 1 using the DFT result of the data stream 2.

FIG. 13 illustrates a more specific example with a=4. Although through the decimation process, the observation range of the data stream 1' is ¼ the observation range of the data stream 1 as shown, Δf is estimated within a range equivalent to the observation range of the data stream 1 by considering aliasing in the same way as in the embodiment 1.

Specifically, let $f_2$ represent the frequency detected by the MAX search circuit 3, and $f_{EST}$ is expressed as follows.

$$f_{EST} = f_2 + m \cdot f_S/a \quad (5)$$

m: an integer satisfying $(f_L \leq f_2 + m \cdot f_S/a \leq f_U)$
A frequency computing circuit 62 is unable to determine m in the equation (5), and thus outputs a plurality of candidates.

Embodiment 6.

Figure 14:
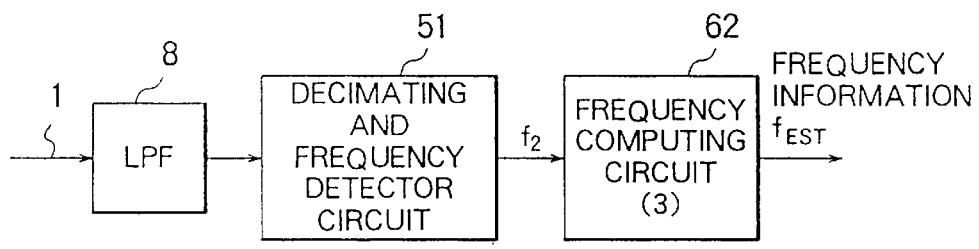
FIG. 14 is a block diagram of the frequency estimating circuit showing the embodiment 6 of the present invention.

FIG. 14 is a block diagram showing a frequency estimating circuit having an LPF, in which the distribution range of Δf is approximately known, and the LPF is used to cut off components outside the distribution range of Δf. As shown, a data stream 1, a decimating and frequency detector circuit 51, and a frequency computing circuit (3) 62 remain identical to those described in connection with the embodiment 5, and the LPF 8 is identical to that described in connection with the embodiment 3.

The operation of the frequency estimating circuit is now discussed. The frequency computing circuit (3) 62 estimates Δf using $f_2$ in the same way as in the embodiment 5, the condition for m in equation (5) is as follows.

m: an integer satisfying ($|f_{EST}| \leq$ pass bandwidth of LPF)

Thus, m satisfying the above condition is determined, and $f_{EST}$ is output as frequency information.

Embodiment 7.

Figure 15:
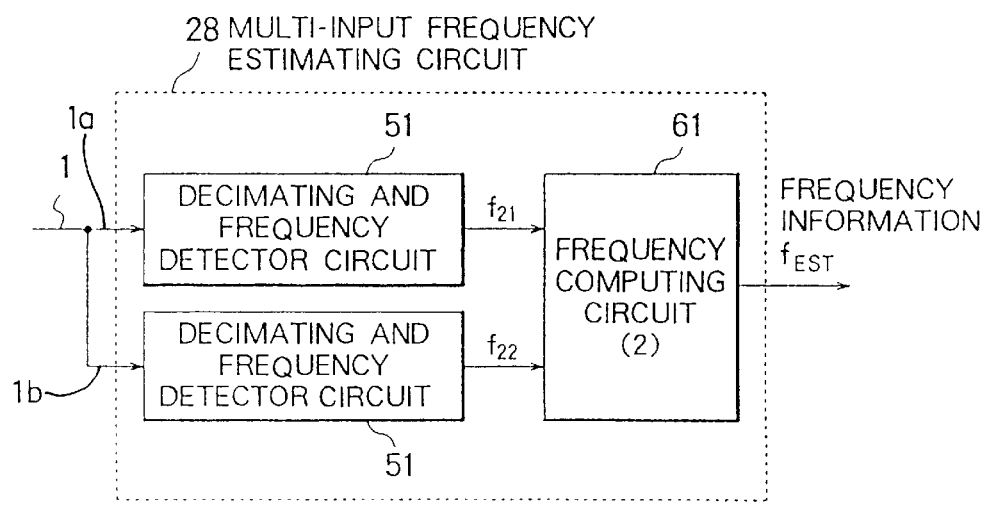
FIG. 15 is a block diagram of the frequency estimating circuit showing the embodiment 7 of the present invention.

FIG. 15 is a block diagram of a frequency estimating circuit, in which the input data stream is decimated by two systems of decimating circuit for frequency estimation. In FIG. 15, an input data stream 1 and a decimating and frequency detector circuit 51 are identical to those described in connection with the preceding embodiment. Designated 61 is a frequency computing circuit that performs computation based on the output from the decimating and frequency detector circuit 51.

The organization shown here in FIG. 15 is referred to as a multi-input frequency estimating circuit 28.

Figure 16:
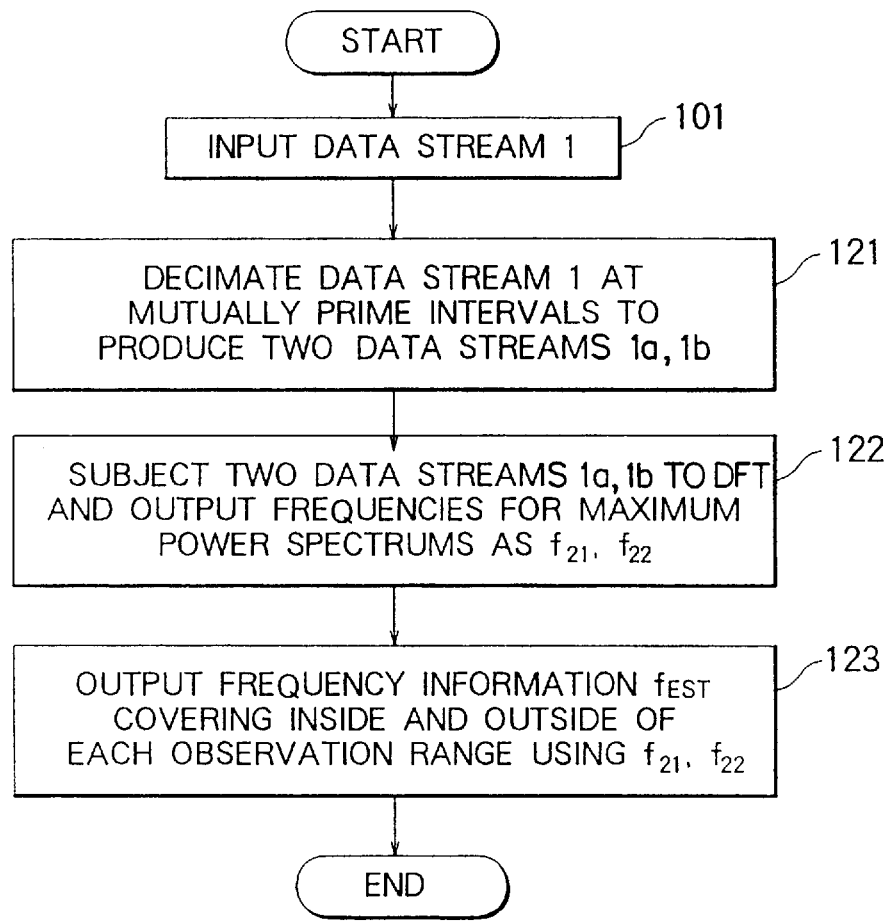
FIG. 16 is a flow diagram showing the operation of the frequency estimating circuit in the embodiment 7 of the present invention.

The operation of the estimating circuit is discussed referring to FIG. 16. The decimating and frequency detector circuit 51 extracts, from the data stream 1, data at intervals p and q, both of which are mutually prime, in order to produce two new data streams 2 (hereinafter referred to as data stream 1a and data stream 1b) (step 121).

The data stream 1a and data stream 1b are subjected to DFT, and frequency corresponding to Δf within each of frequency observable ranges is detected from the maximum value of the spectrum (step 122).

Let $f_{21}$ and $f_{22}$ represent the detected frequencies, and the estimated value of Δf is expressed in consideration of aliasing as follows.

$$f_{EST} = f_{21} + n_1 \cdot f_S/p \quad (6)$$

$$f_{EST} = f_{22} + n_2 \cdot f_S/q$$

$n_1, n_2$: integers, each satisfying $(f_L \leq f_{EST} \leq f_U)$
Δf is estimated by determining n1, n2 that satisfy equation (7).

$$f_{21} + n_1 \cdot f_S/p = f_{22} + n_2 \cdot f_S/q \quad (7)$$

The frequency computing circuit (2) 61 solves the equation (7) using f21, f22, to estimates Δf, and outputs an estimated value as frequency information $f_{EST}$ (step 123). Here again, as in the embodiment 1, the frequency estimating circuit is unable to determine $n_1, n_2$ in the equation (7), and outputs a plurality of candidates.

Embodiment 8.

Figure 17:
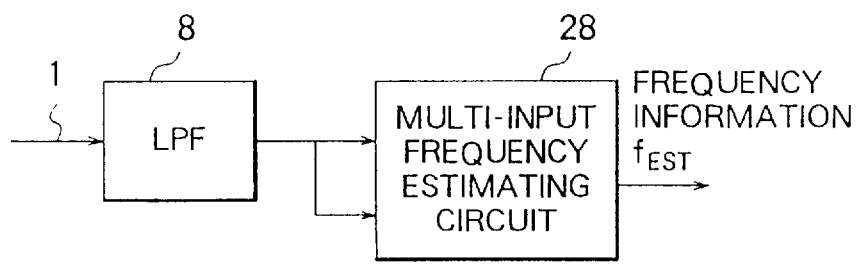
FIG. 17 is a block diagram of the frequency estimating circuit showing the embodiment 8 of the present invention.

FIG. 17 is a block diagram showing a multi-input frequency estimating circuit 28 having an LPF 8, in which the distribution range of Δf is approximately known, and the LPF 8 is used to cut off components outside the distribution range of Δf.

The operation of the multi-input frequency estimating circuit is now discussed. The frequency computing circuit (2) 61 estimates Δf using equation (7) in the same manner as in the embodiment 7, and the condition for $n_1, n_2$ is as follows.

$n_1, n_2$: integers, each satisfying ($|f_{EST}| \leq$ pass bandwidth of LPF)

Figure 18:
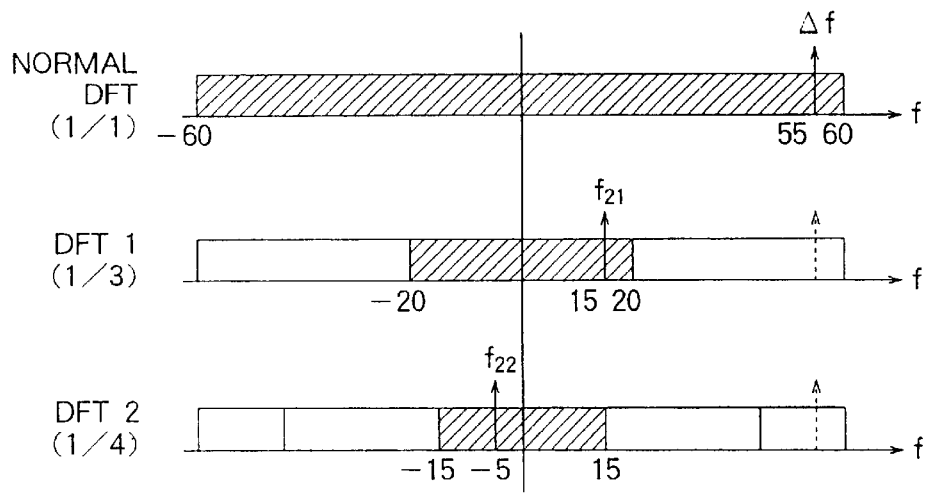
FIG. 18 is a diagram showing the operation of the embodiment 8 of the present invention.

FIG. 18 shows one specific example. Data is extracted from the data stream 1 at intervals of 3 samples and 4 samples to produce two new data streams, which are then subjected to DFT. Since frequency observable ranges are ⅓ and ¼ the full data (frequency resolution remains unchanged), observation ranges are $|f| \leq 20$ Hz, $|f| \leq 15$ Hz if the observation range W1 is $|f| \leq 60$ Hz with the pass bandwidth of the LPF being the observation range W1. Suppose that estimated frequencies are $f_{21} = 15$ Hz
$f_{22} = -5$ Hz then, equation (7) is $$15 + n_1 \cdot 40 = -5 + n_2 \cdot 30$$

By solving equation (7), the frequency computing circuit (2) 61 gives $n_1 = 1$
$n_2 = 2$ thus, $f_{EST} = 55$ Hz Embodiment 9.

Figure 19:
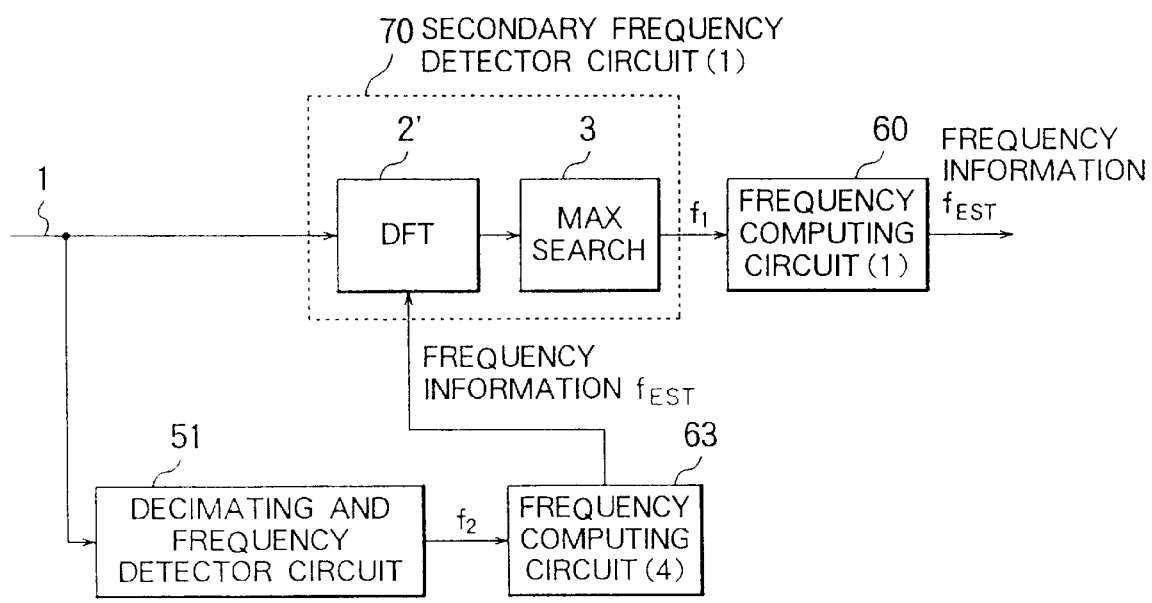
FIG. 19 is a block diagram of the frequency estimating circuit showing the embodiment 9 of the present invention.
Figure 21:
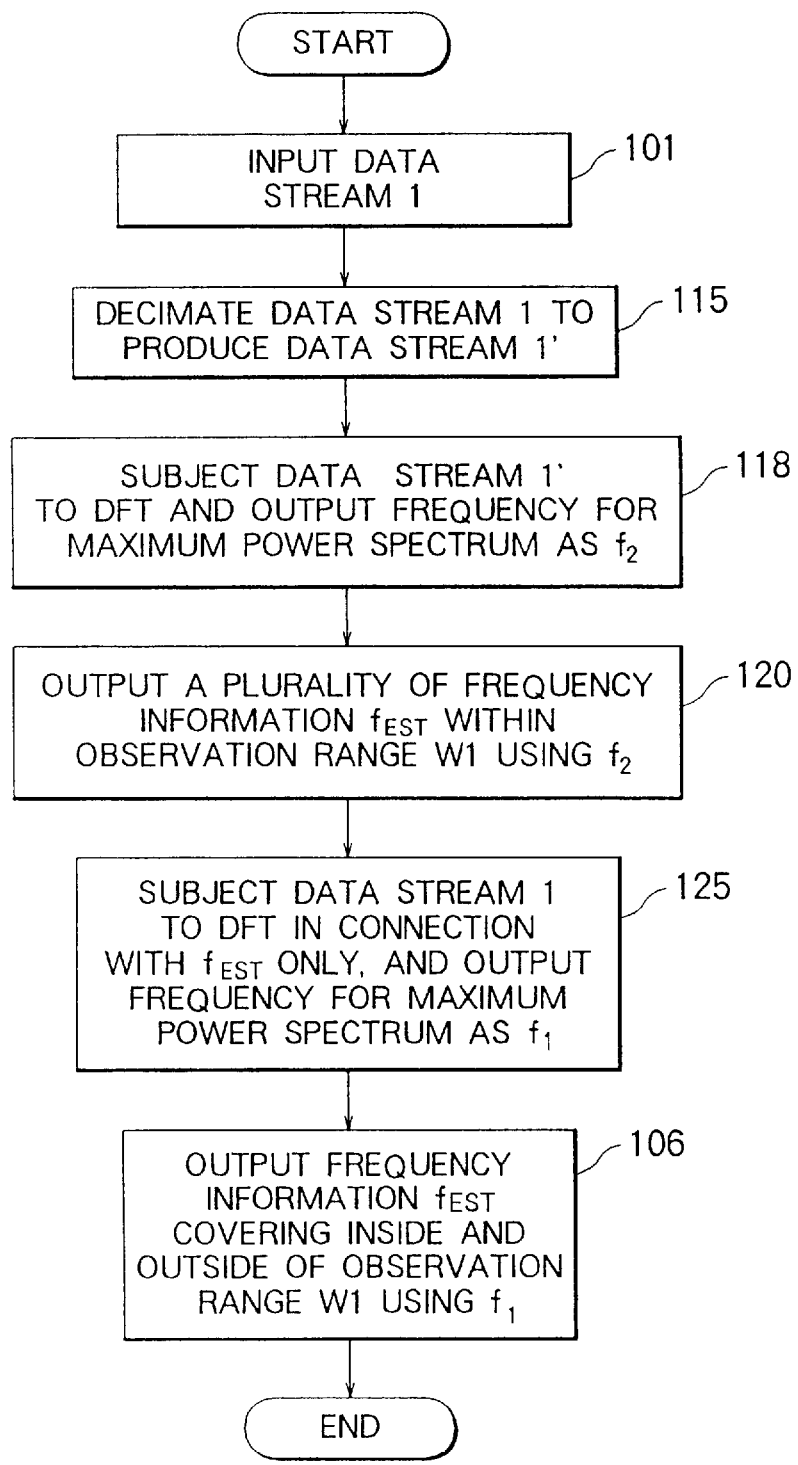
FIG. 21 is a flow diagram showing the operation of the frequency estimating circuit in the embodiment 9 of the present invention.

FIG. 19 is a block diagram showing the embodiment according to the ninth invention of the frequency estimating circuit, FIG. 20 is a diagram illustrating its operation, and FIG. 21 is a flow diagram showing the operation.

In FIG. 19, designated 70 is a secondary frequency detector circuit (1) composed of a DFT circuit 2' and an MAX search circuit 3, and designated 63 is a frequency computing circuit (4) that estimates Δf within an observation range 1 using the frequency information output by a decimating and frequency detector circuit 51 and outputs a plurality pieces of frequency information.

An input data stream 1, a DFT circuit 2', an MAX search circuit 3 and a frequency computing circuit (1) 60 are identical to those described in connection with the embodiment 1, and the decimating and frequency detector circuit 51 is identical to that described in connection with the embodiment 5.

The operation of the frequency estimating circuit is discussed referring to FIG. 19 to FIG. 21. The input data stream 1 is decimated by the decimating and frequency detector circuit 51 at predetermined intervals of a samples to produce a data stream 1' (step 115), the data stream 1' is time-axis to frequency axis converted, the frequency at the maximum level in a spectrum is determined and then output as $f_2$ (step 118). Based on $f_2$, the frequency computing circuit 63 performs computation and outputs frequency information as $f_{EST}$ (step 120).

There remain candidates within a frequency range W1. Since the range outside the frequency range W1 is now going to be observed taking advantage of aliasing, the number of the candidates of Δf is a×n if a range equal to n times the observation range W1 is considered (n: an integer). The number of candidates is reduced in the following technique. If the data stream 1 is used, Δf exists within the observation range 1 and can be estimated.

Thus, in steps 101, 115, 118, and 120, a plurality of $f_{EST}$ are first determined in the same manner as in the embodiment 5. FIG. 20 shows an example with a=4. The DFT circuit 2' performs DFT to the data stream 1 again but at four frequencies only corresponding to Δf based on $f_{EST}$ output from the frequency computing circuit (4) 63 to determine the power spectrums. The MAX search circuit 3 searches the maximum one in the four power spectrums; and then outputs the frequency corresponding to the maximum power spectrum (second from the leftmost one in FIG. 20). This spectrum has a frequency of $f_1$. In this way, the use of the secondary frequency detector circuit (1) 70 reduces the number of candidates to 1/a.

The frequency computing circuit (1) 60 as a succeeding stage performs computation of equation (5) using $f_1$, estimates Δf over a range inclusive of the range outside the observation range W1, and outputs an estimated value as $f_{EST}$ (step 106). Here again, as already described, the frequency estimating circuit is unable to determine m in equation (5), and thus outputs a plurality of candidates.
Embodiment 10.

Figure 22:
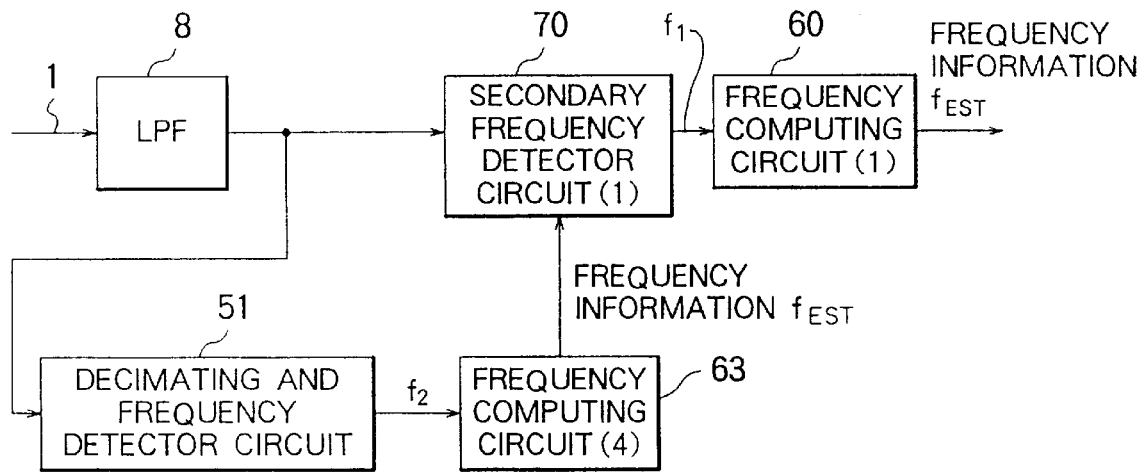
FIG. 22 is a block diagram of the frequency estimating circuit showing the embodiment 10 of the present invention.

FIG. 22 is a block diagram showing a frequency estimating circuit having a LPF, in which the distribution range of Δf is approximately known, and the LPF 8 is used to cut off components outside the distribution range of Δf. FIG. 22 is a block diagram of the embodiment 10 of the frequency estimating circuit.

In the figure, the LPF 8 is identical to that described with reference to the embodiment 3, and an input data stream 1, a decimating and frequency detector circuit 51, a frequency computing circuit (1) 60, a frequency computing circuit (4) 63 and a secondary frequency detector circuit (1) 70 are identical to those described in connection with the embodiment 9.

The operation of the frequency estimating circuit is discussed. Since the distribution range of Δf is approximately known, the distribution range of Δf is within the pass bandwidth of the LPF. Therefore, the computation of the frequency computing circuit (1) 60 is simply performed within the pass bandwidth of LPF 8. Specifically, the frequency computing circuit (1) 60 computes and outputs frequency information $f_{EST}$ with the condition for m as follows.

m: an integer satisfying ($|f_{EST}| \leq$ Pass bandwidth of LPF)
Embodiment 11.

Figure 23:
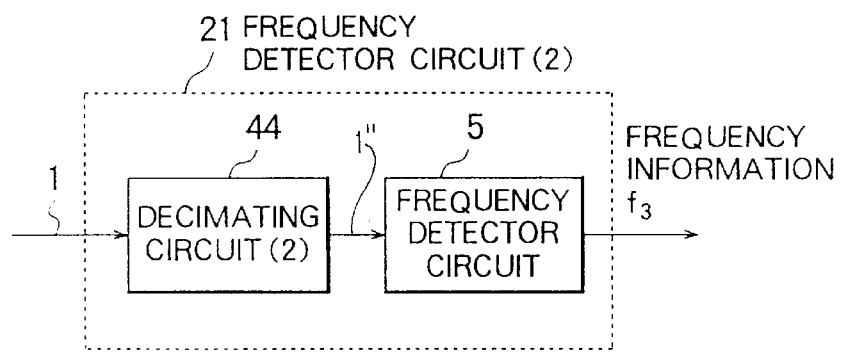
FIG. 23 is a block diagram of the frequency detector circuit (2) in the embodiment 11 of the present invention.

FIG. 23 is a block diagram showing the frequency detector circuit (2) according to the embodiment 11 of the present invention. As shown, designated 44 is a decimating circuit (2) that extracts data from a data stream 1 so that the sample count is 1/b times that of the data stream 1 to produce a data stream 1", and designated 21 is a frequency detector circuit (2) composed of the decimating circuit (2) 44 and a frequency detector circuit 5. The frequency detector circuit 5 is identical to that described in connection with the embodiment 1.

Figure 24:
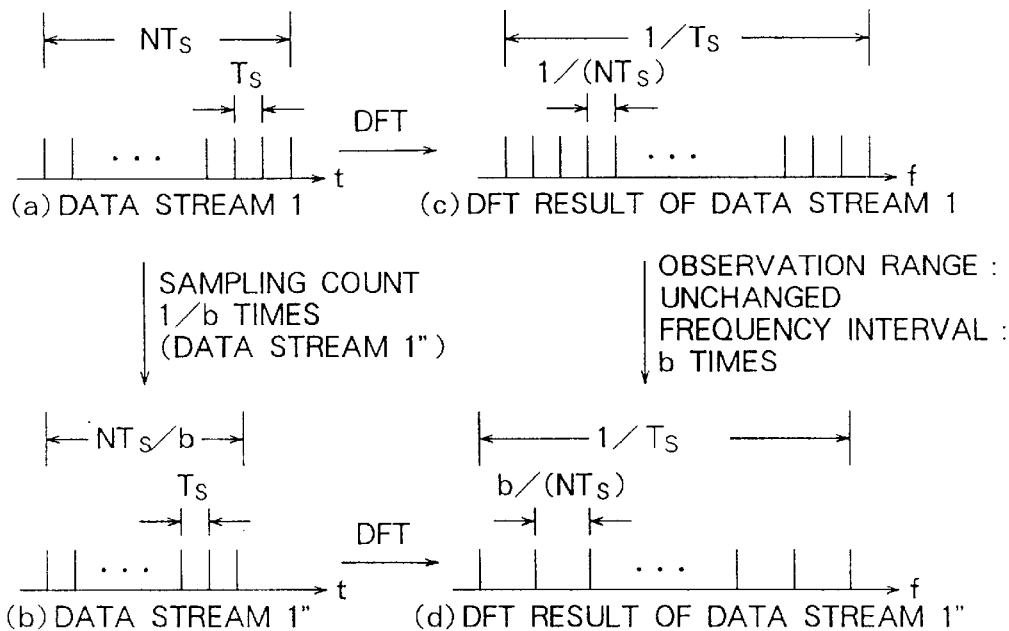
FIG. 24 is a comparison diagram comparing the DFT results derived from the data stream 1 and the data stream 3.

Referring to FIG. 24, the operation of the frequency detector circuit is discussed. The decimating circuit (2) 44 extracts data from the data stream 1 consecutively so that the sample count is 1/b times the data stream 1 and thus produces the data stream 1". The frequency detector circuit 5 performs time-axis to frequency-axis conversion to the data stream 1", determines the frequency of the maximum value power spectrum to output frequency information $f_3$.

FIG. 24 is a comparison diagram that compares the result of DFT operation carried out to the data stream 1 with the result of DFT operation carried out to the data stream 1" that is derived by decimating the data stream 1 to for it to have the sample count 1/b times the data stream 1.

In FIG. 24, (a) shows the data stream 1 having N samples with a sampling period of $T_S$. (b) shows the data stream 1" that is obtained by consecutively decimating the data stream 1 to be 1/b times the data stream 1. (c) and (d) show the results of DFT operations that have been carried out to the data stream 1 and the data stream 1". These results are attributed to the characteristic of DFT.

The DFT result of the data stream 1" is $1/T_S$ times the DFT result of the data stream 1 in terms of observation range, but the frequency interval of the DFT result of the data stream 1" is $b/NT_S$, which is b times that of the data stream 1.

Therefore, although the decimation operation reduces the computational load, the frequency detector circuit 5 presents a lower frequency estimation accuracy in the DFT result of the data stream 1" than in the DFT result of the data stream 1, and the frequency detector circuit (2) 21 in this embodiment is suitable for approximate estimation of frequency.
Embodiment 12.

Figure 25:
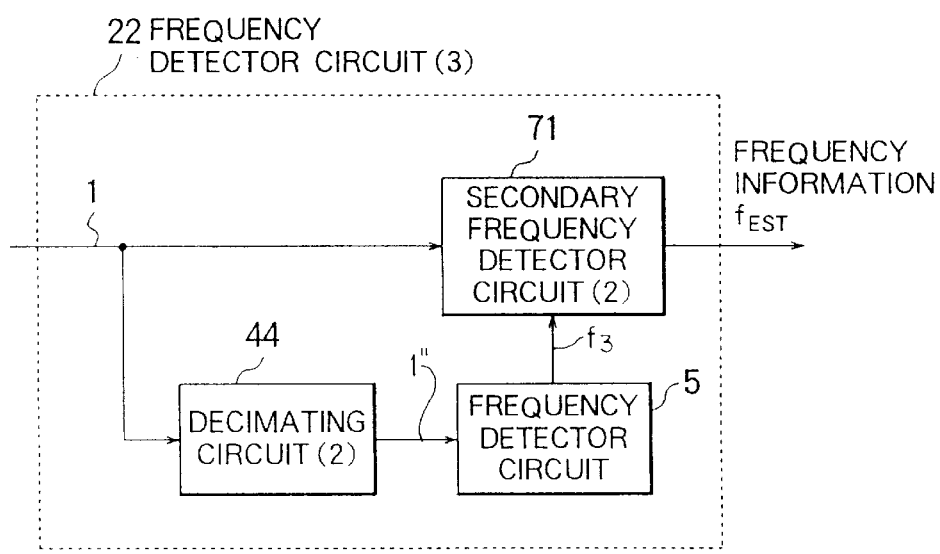
FIG. 25 is a block diagram of the frequency detector circuit (3) in the embodiment 12 of the present invention.

FIG. 25 is a block diagram showing the frequency detector circuit according to the embodiment 12 of the present invention. There are shown a decimating circuit (2) 44, a frequency detector circuit 5, and a secondary frequency detector circuit (2) 71. The organization comprising these component is referred to as a frequency detector circuit (3) 22.

Figure 26:
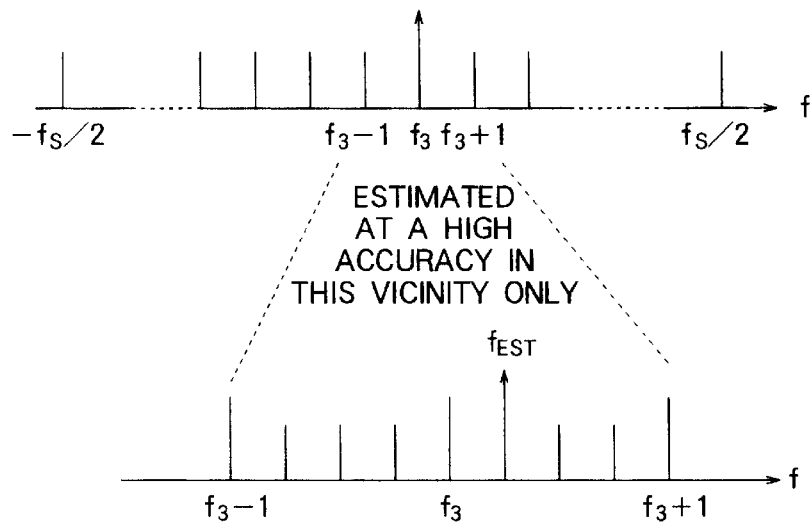
FIG. 26 is a diagram showing the operation of the embodiment 12 of the present invention.
Figure 27:
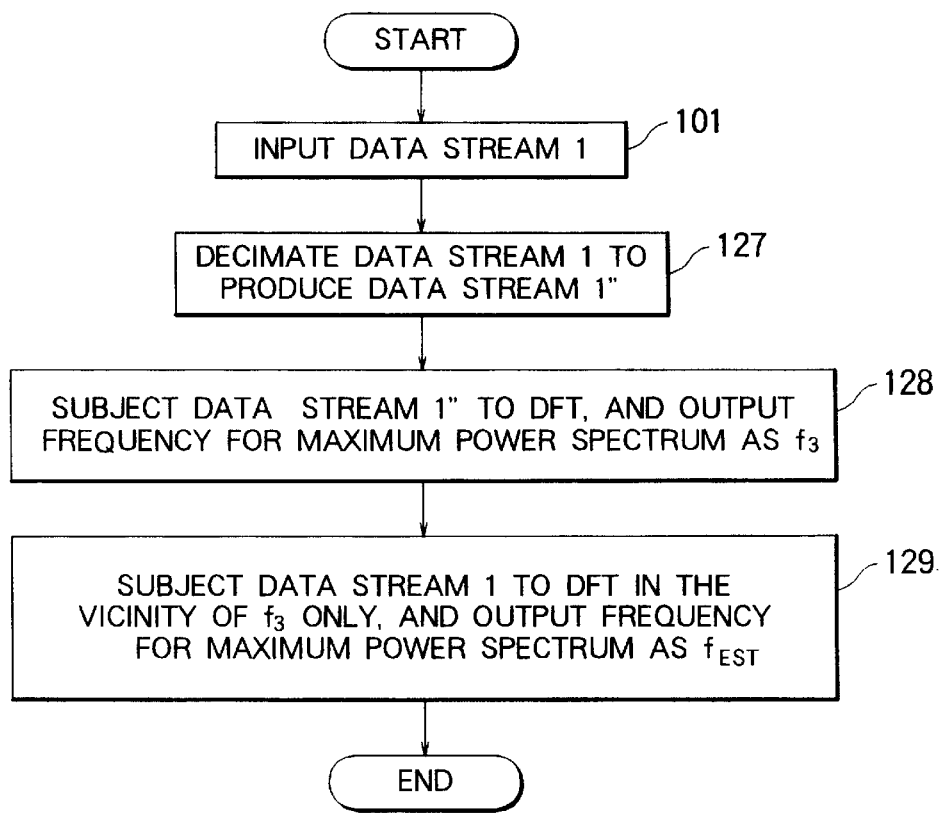
FIG. 27 is a flow diagram showing the operation of the frequency detector circuit (3) in the embodiment 12 of the present invention.

FIG. 26 illustrates the operation of the frequency detector circuit, and FIG. 27 is a flow diagram of the operation. In FIG. 25, designated 71 is the secondary frequency detector circuit (2) 71 composed of the DFT circuit 2' and MAX search circuit 3. The decimating circuit (2) 44 and the frequency detector circuit 5 are identical to those described in connection with the embodiment 11.

Referring to FIG. 25 to FIG. 27, the operation of the frequency detector circuit is discussed. The decimating circuit (2) 44 decimates the data stream 1 by 1/b times to produce a data stream 1" in the same manner as in the embodiment 11 (step 127). The frequency detector circuit 5 performs DFT to the data stream 1", determines the frequency of the maximum power level spectrum, and outputs frequency information $f_3$ (step 128).

The secondary frequency estimating circuit (2) 71 performs DFT to $f_3$ that is estimated based on the DFT result of the data stream 1" and to the data stream 1 in the vicinity of $f_3$, and outputs the result of frequency estimation as frequency information $f_{EST}$ (step 129).

FIG. 26 shows an example of operation with b=4. Since as shown, the frequency interval is quadrupled as a result of decimation in the DFT result by the frequency detector circuit 5, the secondary frequency detector circuit (2) 71 performs afresh frequency estimation in the data stream 1 in frequencies in the vicinity of $f_3$ (a total of 9 frequencies $f_3-1 \sim f_3+1$ in FIG. 26). In the secondary estimation, the frequency interval becomes quartered, and the estimation offers a higher accuracy compared with the estimation of the data stream 1".
Embodiment 13.

Figure 28:
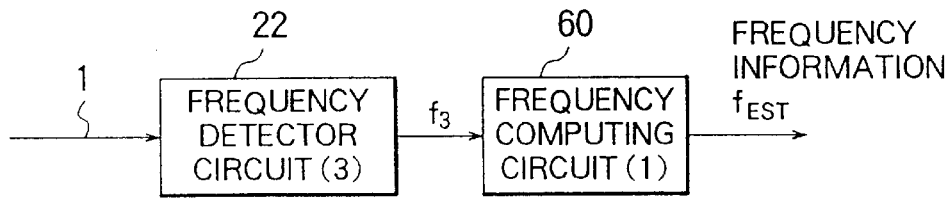
FIG. 28 is a block diagram of the frequency estimating circuit showing the embodiment 13 of the present invention.
Figure 29:
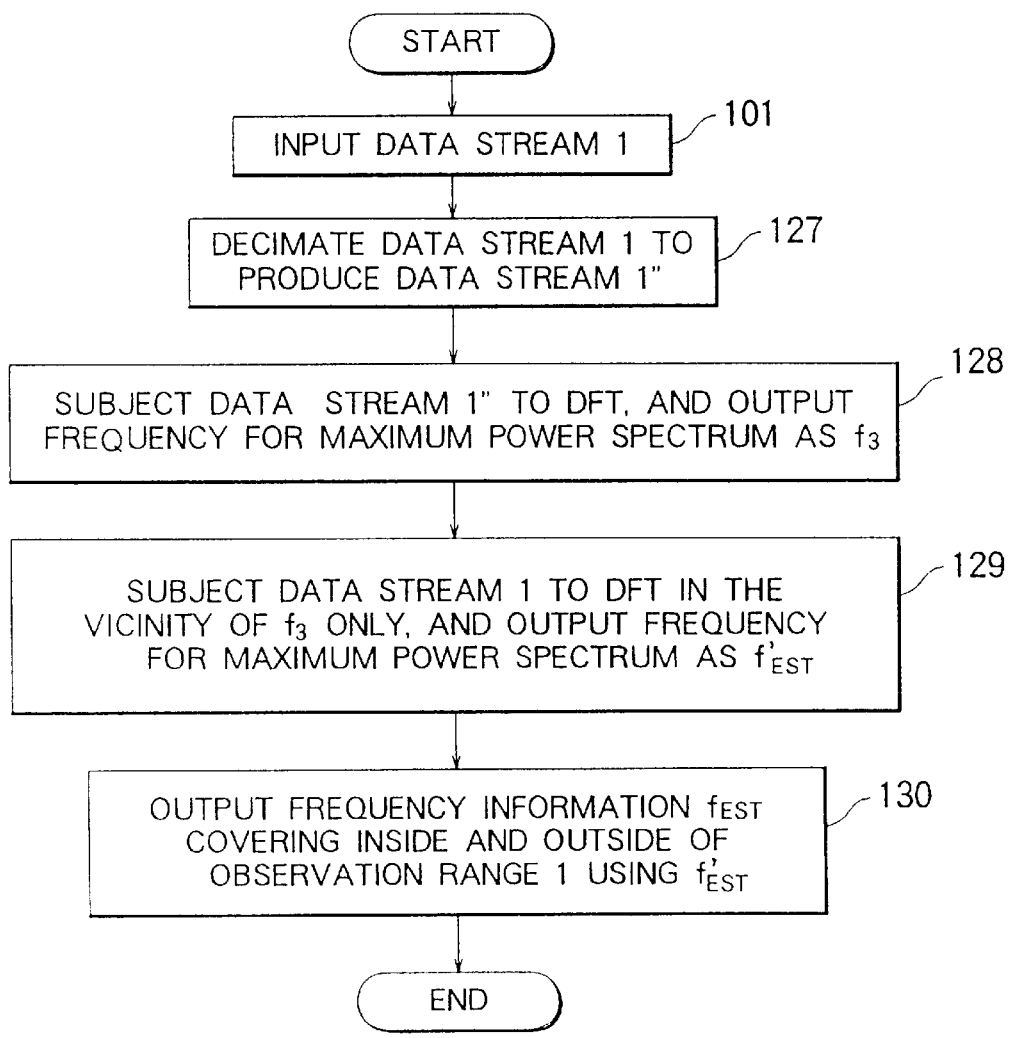
FIG. 29 is a flow diagram showing the operation of the frequency estimating circuit in the embodiment 13 of the present invention.

FIG. 28 is a block diagram of the frequency estimating circuit according to the thirteenth in which the preceding embodiment 12 is incorporated in the embodiment 1. There are shown a input data stream 1, a frequency detector circuit (3) 22 and a frequency computing circuit (1) 60. FIG. 29 is a flow diagram showing the operation of the frequency estimating circuit.

The operation of the frequency estimating circuit is now discussed. The frequency detector circuit (3) 22 produces a data stream 1" by decimating the input data stream 1 so that the data stream 1" has a sample count 1/b times the sample count N in the input data stream 1 (step 127), the data stream 1" is then subjected to time-axis to frequency-axis conversion, the frequency of maximum power level spectrum is determined and thus $f_3$ is determined (step 128).

DFT is again performed to only the vicinity of $f_3$ and frequency information is output as $f_{EST}$ (step 129). The frequency computing circuit (1) 60 estimates $\Delta f$ in view of aliasing in the same manner as in the embodiment 1, and frequency information $f_{EST}$ is estimated (step 130).

Embodiment 14.

Figure 30:
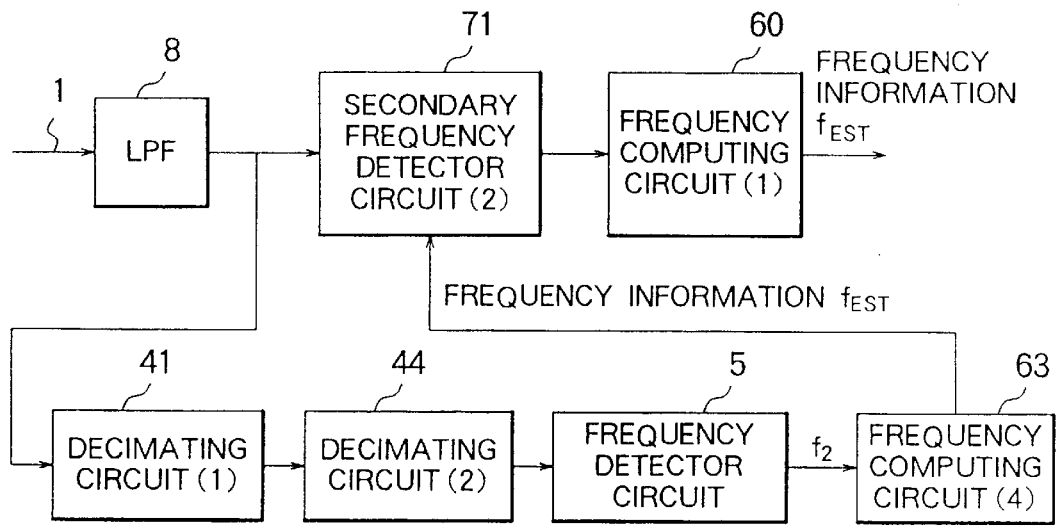
FIG. 30 is a block diagram of the frequency estimating circuit showing the embodiment 14 of the present invention.

FIG. 30 is a block diagram showing the frequency estimating circuit of the fourteenth embodiment of the present invention. Described herein is the embodiment in which above described frequency detector circuit described in connection with the embodiment 11 or the embodiment 12 is incorporated in the frequency estimating circuit described in connection with the embodiment 10.

As shown, the input data stream 1, frequency computing circuit (1) 60, frequency estimating circuit (4) 63 and secondary frequency detector circuit (2) 71 are identical to those described in connection with the embodiment 10, the decimating circuit (1) 41 is identical to that described in connection with the embodiment 5, and the frequency detector circuit 5 and decimating circuit (2) 44 are identical to those described in connection with the embodiment 11.

The operation of this embodiment is discussed referring to FIG. 30. By allowing the input data stream 1 to pass through the decimating circuit (1) 41 and the decimating circuit (2) 44, a new data stream is produced. When the new data stream is subjected to DFT, both characteristic 1 and characteristic 2 of DFT already described are applied to the DFT result, and when the frequency estimated by the frequency detector circuit 5 is compared with the DFT result of the input data stream 1, the computational load involved is smaller, the estimated f is degenerated into the observation range W2 and its discrimination is poor.

For this reason, the secondary frequency detector circuit (2) 71 performs afresh frequency estimation using the input data stream 1 in the vicinity of the frequency estimated by the frequency computing circuit (4) 63, and then estimates frequency information $f_{EST}$. The order of arrangement is not important in that the decimating circuit (1) 41 may be arranged ahead of the decimating circuit (2) 44 and vice versa, or both circuits may perform decimation concurrently.

Embodiment 15.

Figure 31:
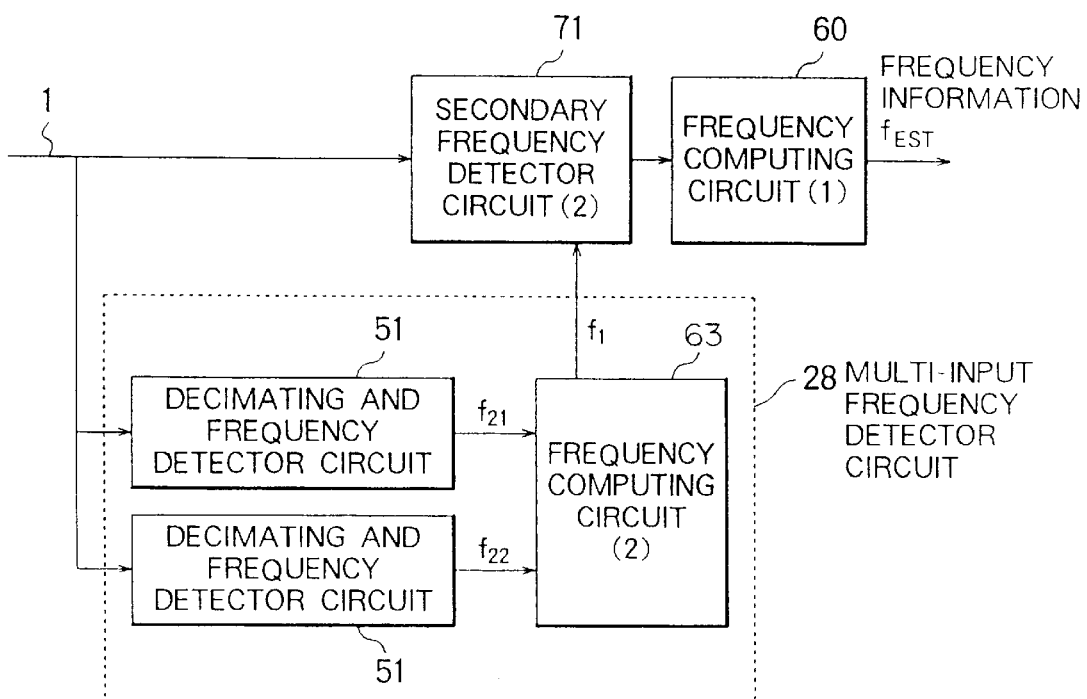
FIG. 31 is a block diagram of the frequency estimating circuit showing the embodiment 15 of the present invention.

FIG. 31 is a block diagram showing the frequency estimating circuit of the fifteenth embodiment of the present invention. Described herein is the embodiment in which the secondary frequency detector circuit described in connection with the embodiment 12 is incorporated in the frequency estimating circuit described in connection with the embodiment 7.

As shown, a decimating and frequency detector circuit 51, a frequency computing circuit (2) 63, and a multi-input frequency estimating circuit 28 are identical to those described in the embodiment 7, the secondary frequency estimating circuit (2) 71 is identical to that described in the embodiment 12, and the frequency computing circuit (1) 60 is identical to that described in the embodiment 1.

The operation of the frequency estimating circuit is now discussed referring to FIG. 31. Two decimating and frequency detector circuits 51 decimate the input data stream 1 at two different intervals which are mutually prime to produce data streams 2. Each data stream is subjected to time-axis to frequency-axis conversion, and frequencies in the vicinity of the frequencies of maximum power level spectrums in the data spectrums 2 are output and frequencies corresponding to several power spectrums from the power spectrum of highest level, as $f_{21}$ and $f_{22}$, are output. The frequency computing circuit 61 computes equation (7) using $f_{21}$, $f_{22}$, and outputs a plurality of frequency information $f_1$.

In response to the time-axis to frequency-axis conversion of the input data stream 1, the secondary frequency estimating circuit (2) 71 searches power spectrums in the vicinity of the frequency information $f_1$, from the frequency computing circuit 61 to find and then output the frequency of the maximum value power spectrum. The frequency computing circuit (1) 60 computes equation (2) based on the frequency information to estimate frequency outside the observation range 1, and then outputs the estimated frequency information $f_{EST}$.

Embodiment 16.

Figure 32:
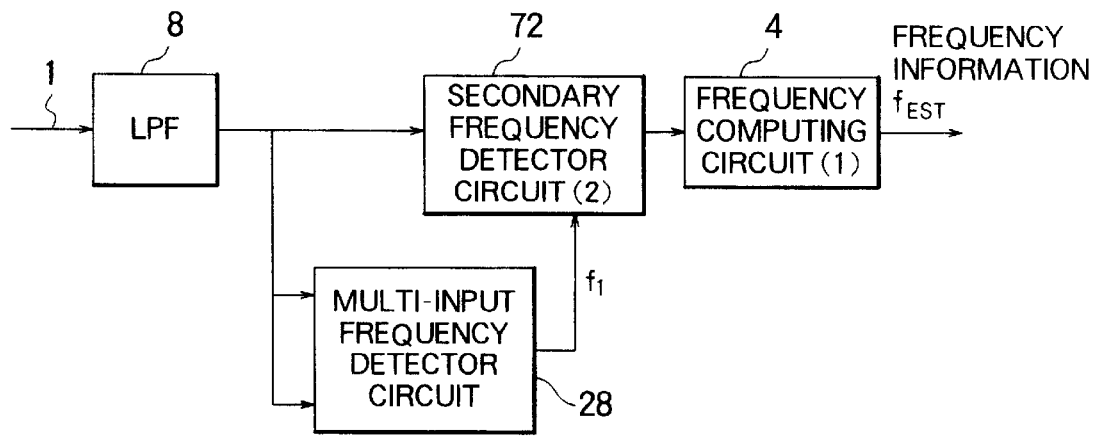
FIG. 32 is a block diagram of the frequency estimating circuit showing the embodiment 16 of the present invention.

FIG. 32 shows the sixteenth embodiment which is constructed of the preceding embodiment with an LPF 8 added, wherein its frequency offset is approximately known.

The operation of this embodiment is now discussed referring to FIG. 32. The operation of the multi-input frequency detector circuit 28 and secondary frequency detector circuit (2) 71 is identical to that of the preceding embodiment. In this embodiment, since the distribution range of the carrier is approximately known, the frequency estimating circuit results in an acceptable frequency estimation within the observation range that is determined by a sampling period at which the input data stream 1 is sampled.

The frequency computing circuit (1) computes equation (2) based on the output information from the multi-input frequency detector circuit 28 with the condition for m as follows and outputs $f_{EST}$.

m: an integer satisfying ($|f_{EST}|$≦Pass bandwidth of LPF)

Embodiment 17.

Figure 33:
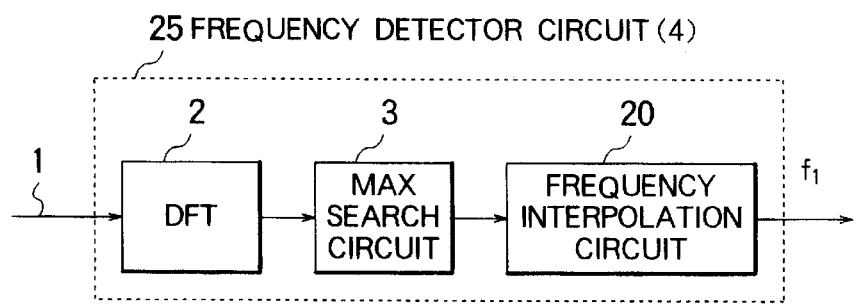
FIG. 33 is a block diagram of the frequency detector circuit (4) in the embodiment 17 of the present invention.

FIG. 33 is a block diagram of the frequency detector circuit having frequency interpolation circuit therewithin. Figure shows the embodiment in which a frequency interpolation circuit is incorporated in the detector circuit of the embodiment 1.

The operation of this embodiment is now discussed. The DFT circuit 2' and the MAX search circuit 3 perform frequency estimation using the power spectrum of the input data stream 1. Although the frequency that gives a maximum power spectrum is conventionally output as frequency information $f_1$, the frequency that can be observed as a result of DFT is discrete value, and estimation error takes place if $\Delta f$ fails to agree with the frequency point of observation.

Figure 34:
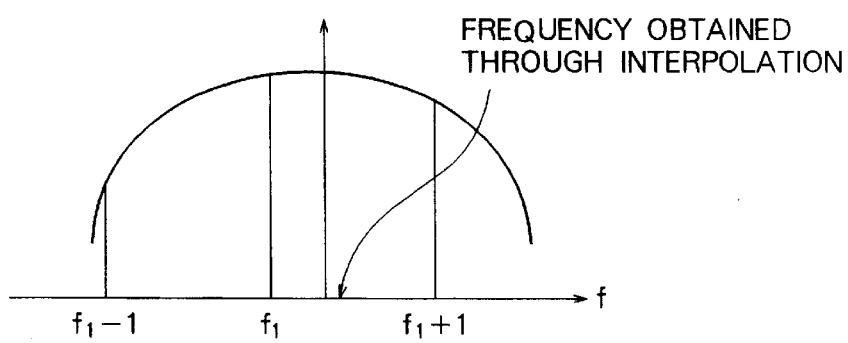
FIG. 34 is a diagram showing the operation of interpolation.

For this reason, to estimate frequency at a higher accuracy level, the output frequency of the MAX search circuit 3 derived from the maximum power spectrum is interpolated. As an example of interpolation, Lagrange's secondary interpolation is used herein. FIG. 34 shows the operation of interpolation. In FIG. 34, it is assumed that $f_1$ is at a maximum.

A frequency interpolation circuit 20 interpolates between three power values, a power value at $f_1$ and power values at two points ($f_1-1$, $f_1+1$) adjacent to $f_1$, and then estimates the frequency that is supposed to give the true peak power value. The frequency interpolation circuit 20 performs interpolation in this way, and outputs afresh as $f_1$ the frequency resulting from interpolation.

Embodiment 18.

Figure 35:
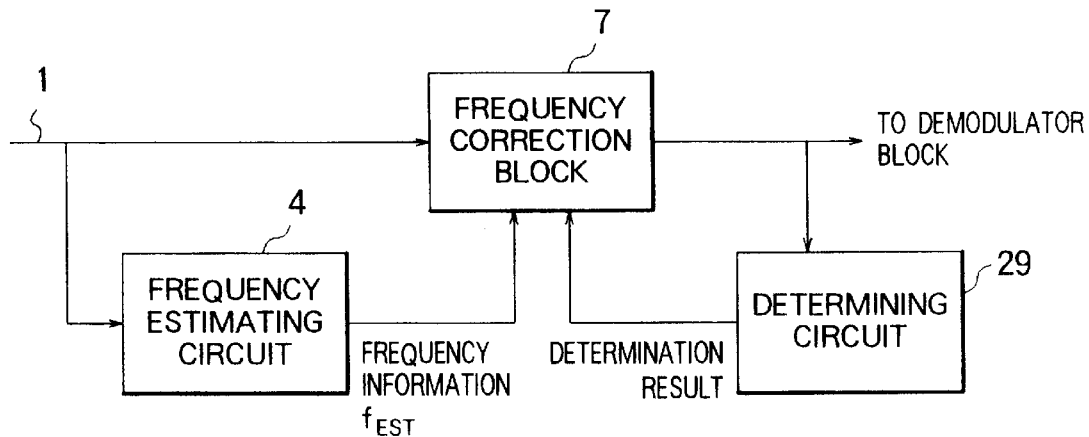
FIG. 35 is a block diagram of the AFC circuit showing the embodiment 18 of the present invention.

FIG. 35 is a block diagram of an AFC circuit as the embodiment 11 according to the eleventh invention in which the frequency estimating circuit is incorporated. As shown, an input data stream 1 and a frequency estimating circuit 4 are identical to those described in connection with the embodiment 1. There are also shown a frequency correction block 7 for correcting a received signal and a determining circuit 29 for determining synchronization.

Figure 36:
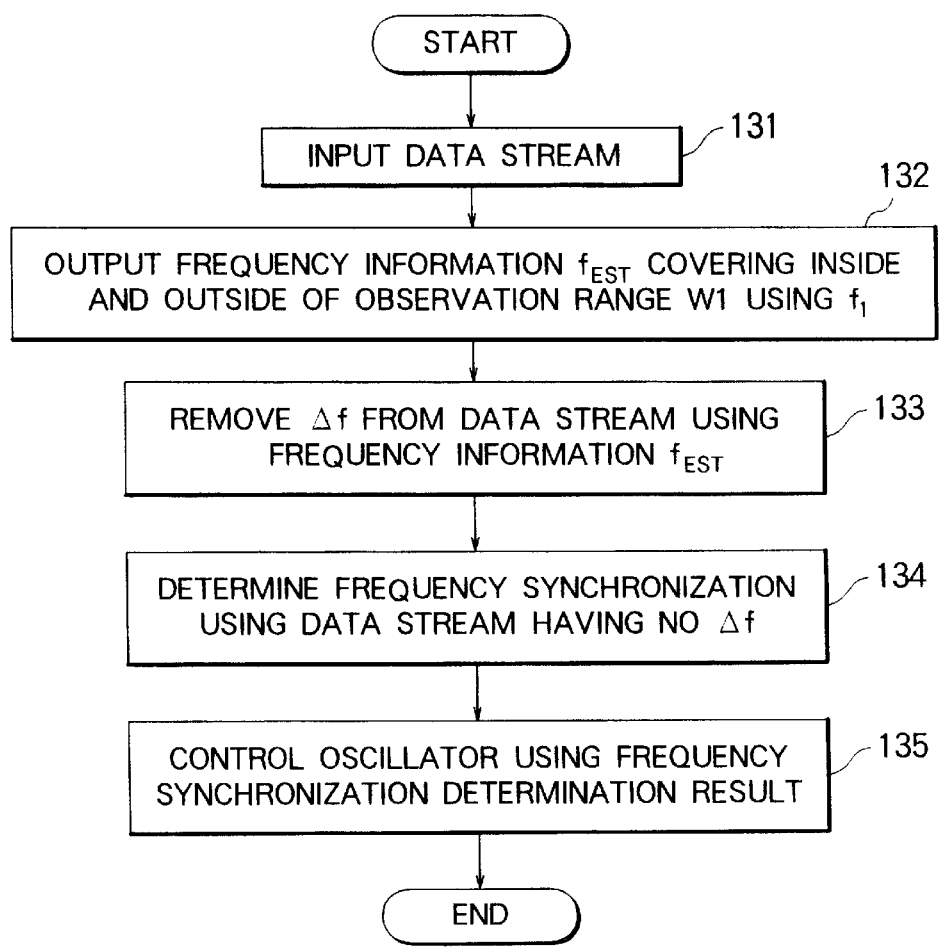
FIG. 36 is a flow diagram showing the operation of the AFC circuit of the present invention.

The operation of this embodiment is now discussed referring to the flow diagram in FIG. 36.

The frequency estimating circuit 4 time-axis to frequency-axis converts the input data stream 1 to determine a power spectrum, and determines the frequency corresponding to the maximum power, computes a predetermined equation (equation (2) in this case) to estimate $\Delta f$, and outputs a plurality of frequency information $f_{EST}$ (step 132).

The frequency correction block 7 removes $\Delta f$ from the input data stream 1 using the plurality of frequency information $f_{EST}$ (step 133) to produce a plurality of demodulated data streams. The determining circuit 29 determines the synchronization of frequency using the plurality of demodulated data streams output from the frequency correction block (step 134), and outputs its determination result to the frequency correction block 7.

Figure 37:
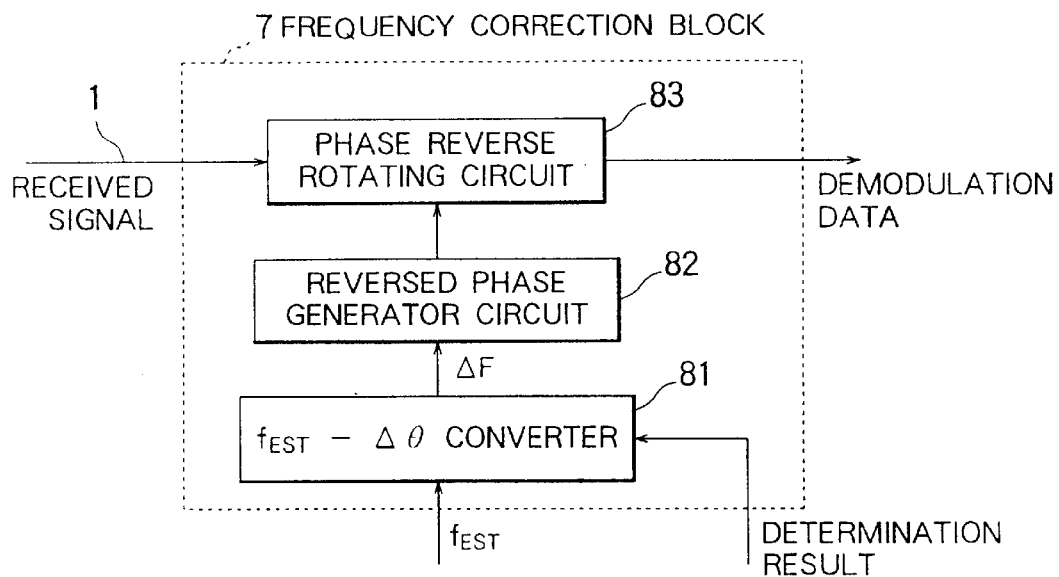
FIG. 37 is a block diagram of the frequency correction block in the AFC circuit of the present invention.

The frequency correction block 7 is now discussed further in detail. FIG. 37 shows an example of the organization of the frequency correction block 7. The $f_{EST}$–$\Delta\theta$ converter 81 determines $\Delta f$ based on $f_{EST}$ output by the frequency estimating circuit 4. A reversed phase generator circuit 82 determines reversed phase angle of rotation at each sampling point using $\Delta\theta$ determined by the $f_{EST}$–$\Delta\theta$ converter 81.

A phase reverse rotating circuit 83 removes a quantity of phase change from the received data stream based on the input data stream 1 and the angle of rotation corresponding to each data. $\Delta f$ is removed in this way. As data to be demodulated, the received signal having no $\Delta f$ is output to the determining circuit 29 and a demodulator block at the next stage.

Next, $\Delta f$ is removed from the received signal 1 based on a plurality of frequency information $f_{EST}$ to produce a plurality of data streams. One method of removing $\Delta f$ is discussed next.

Figure 38:
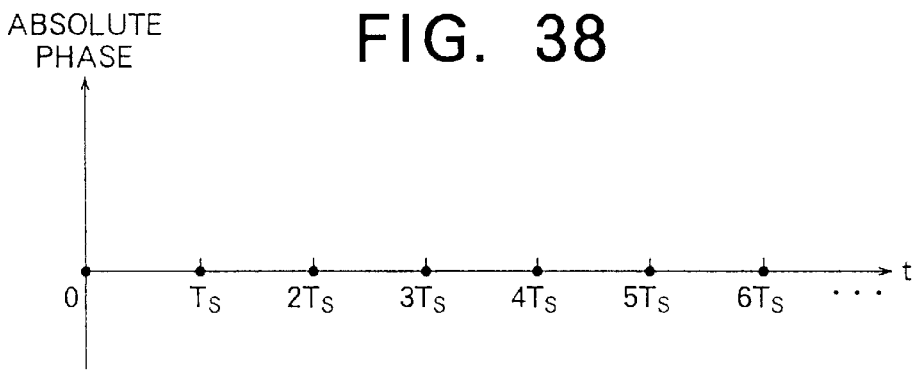
FIG. 38 is a diagram showing the operation of the frequency correction block in the AFC circuit of the present invention.
Figure 39:
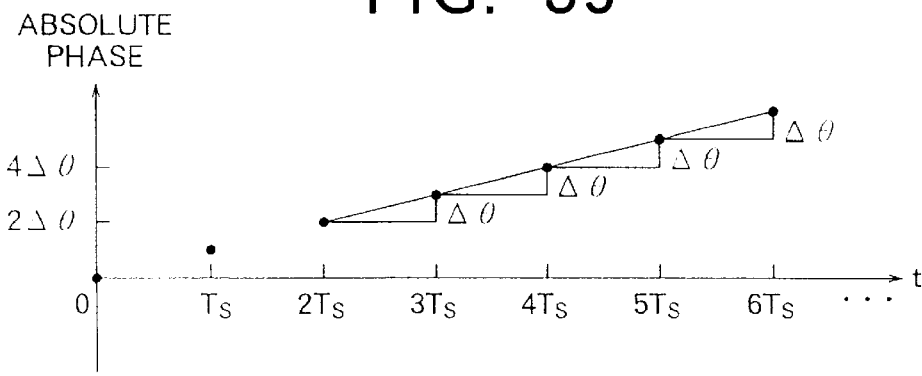
FIG. 39 is a diagram showing the operation of the frequency correction block in the AFC circuit of the present invention.

Since the received signal is a pilot signal (non-modulated signal), the phase of the received signal is 0 with $\Delta f=0$ regardless of sampling timing ($T_S$) as shown in FIG. 38. If $\Delta f\neq 0$, however, the phase of the received signal varies with time as shown in FIG. 39, and the quantity of phase change $\Delta\theta$ is $$\Delta\theta = \Delta f \times 360 \times T_S$$

$\Delta\theta$: Phase change per sample (degrees)
$\Delta f$: Frequency offset estimated (Hz)
$T_S$: Sampling period (seconds)

Figure 40:
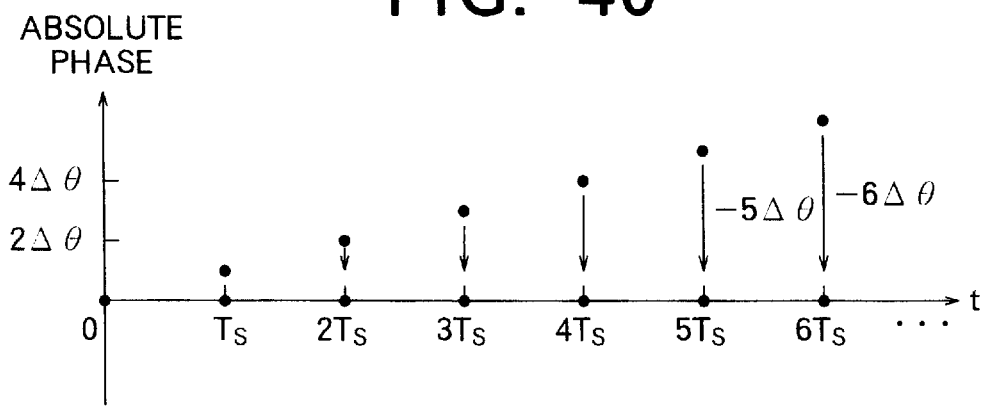
FIG. 40 is a diagram showing the operation of the frequency correction block in the AFC circuit of the present invention.

Since the phase change is determined by determining using the frequency information $f_{EST}$ estimated by the frequency estimating circuit and the sampling period $T_S$, the phase at each symbol becomes 0 if the phase change is fed back at each symbol. The frequency correction block 7 thus determines $\Delta\theta$ based on $f_{EST}$ estimated by the frequency estimating circuit 4. A complex multiplier is used to correct the phase at each sampling point as shown in FIG. 40. The data stream thus corrected is output to the later stage.

One example of determining method is now discussed. A known pattern detection such as UW detection is performed. Since the distribution range of $\Delta f$ is generally finite ($f_L \leq \Delta f \leq f_U$), m in equation (2) is a finite number. Suppose that the number of a plurality of frequency information output by the frequency estimating circuit 4 is K, and that these pieces of frequency information are $f_{EST1}$~$f_{ESTK}$.

The frequency correction block 7 produces a demodulated data stream by removing $\Delta f$ corresponding to $f_{EST1}$ from the received data, and then outputs it to the determining circuit 29. The determining circuit 29 detects a known pattern used in the system such as UW in the demodulated data stream. When no known pattern is detected, the determining circuit 29 outputs no-detection signal to the frequency correction block 7.

Receiving the no-detection signal, the frequency correction block 7 outputs a demodulated data stream that is produced by removing $\Delta f$ corresponding to next frequency information $f_{EST2}$ from the received signal. This process is repeated until a known pattern is detected.

When the known pattern is detected, the determining circuit 29 outputs a detected signal to the frequency correction block 7. When the frequency correction block 7 receives the detected signal, it fixes a frequency to be corrected, with a frequency corresponding to it, and corrects with the frequency thereafter. If no known pattern is detected in connection of all K candidates, the AFC operation is regarded as failed.

The prior art AFC circuit can estimate $\Delta f$ only within the observable range. Thus, the prior art AFC suffers the disadvantage that it cannot perform frequency estimation when $\Delta f$ is large and outside the observable range even with no influence of noise. According to the present invention, however, the observable range is infinite, and $\Delta f$ is estimated without fail with no influence of noise or the like, and a highly accurate and reliable synchronization is established.
Alternative Embodiment 1

In the embodiment 9 and embodiment 10, the data stream 1' is used to estimate $\Delta f$ within the observation range W2, and a plurality of candidates for $\Delta f$ within the observation range W1 are estimated by the frequency computing circuit (1) 60, DFT is performed only these plurality of frequencies by the secondary frequency estimating circuit (1) 70, and $f_{EST}$ within the observation range W1 is determined, and the use of the characteristic 1 of DFT is on condition that a must be a factor of sample count N.

Described herein is the embodiment in which a is not a factor of the sample count N.

Figure 41:
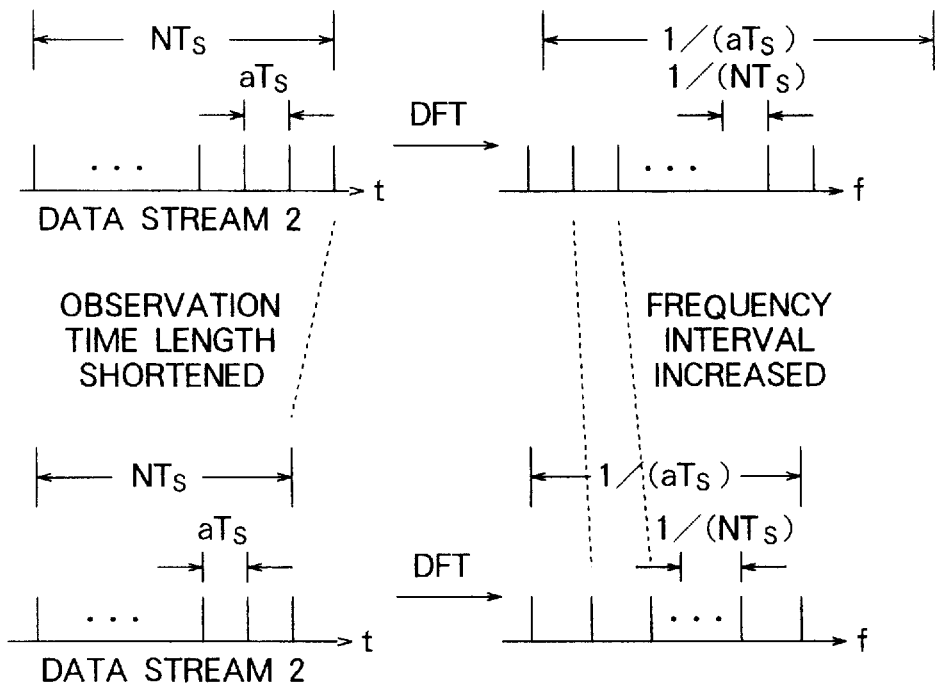
FIG. 41 is a diagram showing the DFT result with a not being a factor of the sample count N.

FIG. 41 shows the DFT result when a is not a factor of the sample count N. The operation of the embodiment is now discussed referring to FIG. 41. When a is not a factor of the sample count N, N cannot be divided by a, and if data extraction is performed from the first sample at intervals of a samples, d data remains at the end of the data stream (d<a), an observation time length for DFT is shortened, and the observation time length is expressed by equation (8).

$$N'\cdot T_S = (N-d)\cdot T_S \text{ where } N'=N-d \quad (8)$$

As a result, the frequency interval becomes longer, and it can be expressed by equation (9) as follows.

$$1/(N'\cdot T_S) = 1/\{(N-d)\cdot T_S\} \quad (9)$$

In this way, since the frequency point of observation with the data stream 1' subjected to DFT is different from the frequency point of observation with the data stream 1 subjected to DFT, the secondary frequency estimating circuit (1) 70 cannot observe the frequency that corresponds to the estimated value $f_{EST}$ with the data stream 1'. In such a case, therefore, the secondary frequency estimating circuit (1) 70 performs DFT to the data stream 1 at a plurality of points of observation in the vicinity of $f_{EST}$.

Alternative Embodiment 2

In the embodiment 7 and embodiment 8, as well, the use of the characteristic 1 of DFT is on condition that a is a factor of the sample count N.

Described herein is the embodiment in which a is not a factor of the sample count N. When a is not a factor of the sample count N in both decimating circuits 51 or one of decimating circuits 41, the frequency interval is expressed by equation (9), estimated values $f_{21}$, $f_{22}$ from two decimating and frequency detector circuits are ones over different frequency intervals, and thus $n_1$, $n_2$ satisfying equation (5) do not exist.

In such a case, the frequency computing circuit (2) 63 uses equation (10) modified from equation (5) to determine $n_1$, $n_2$.

$$f_{21}+n_1 \cdot f/p = f_{22}+n_2 f/q \tag{10}$$

Alternative Embodiment 3

In the embodiment 18, the AFC is arranged in the form of feedforward type, but alternatively, it may be arranged in the form of feedback type.

Figure 42:
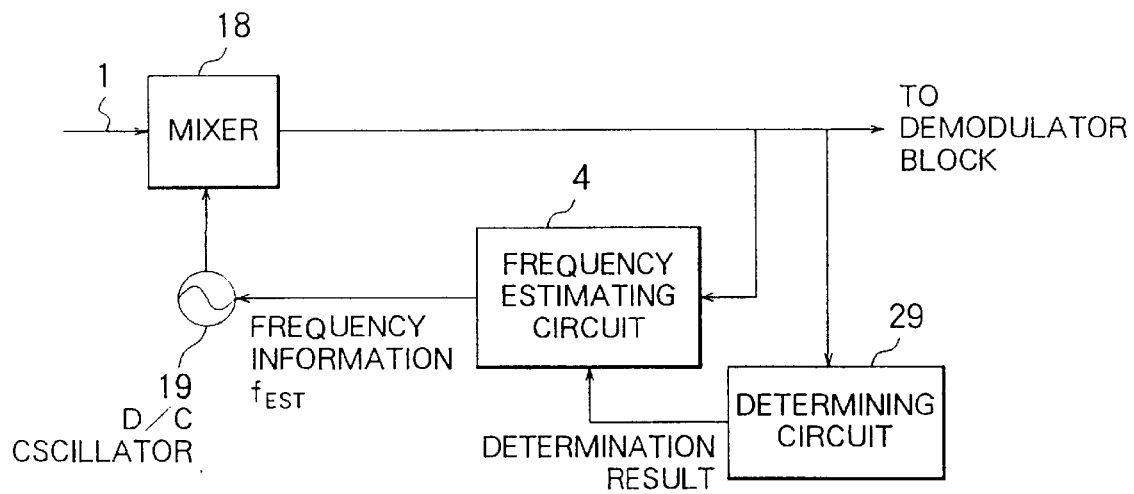
FIG. 42 is a block diagram showing the feedback type AFC circuit of the present invention.

Such an arrangement is shown in FIG. 42.

In FIG. 42, a mixer 18 multiplies the output from an oscillator for down-conversion (hereinafter referred to as D/C) by a received signal input to remove $\Delta f$ from the received signal, and a D/C oscillator 19 outputs the frequency corresponding to the frequency information $f_{EST}$ output by a frequency estimating circuit 4, and the frequency estimating circuit 4 and a determining circuit 29 are identical to those described in connection with the embodiment 18.

In the same way as in the embodiment 18, the frequency estimating circuit 4 estimates $\Delta f$ based on the output of the mixer 18, and outputs the frequency information $f_{EST}$. The D/C oscillator 19 outputs the frequency corresponding to the frequency information $f_{EST}$, and the mixer 18 multiplies the output from the D/C oscillator 19 by the input received signal to remove $\Delta f$ from the received signal. In the same way as in the embodiment 18, the determining circuit 29 determines the synchronization of frequency using the demodulated data stream output in serial order by the mixer 18, and outputs its determination result to the frequency estimating circuit 4.

Thereafter, the determination of the synchronization of frequency are performed in the same way as in the embodiment 18.

Alternative Embodiment 4

The frequency estimating circuit 4 judges whether or not the frequency has been determined to be synchronous based on the determined result of the determining circuit 29. If the frequency is determined not to be synchronous, the frequency estimating circuit 4 outputs the next frequency information $f_{EST}$ to the D/C oscillator 19, and determines the synchronicity of the frequency using that frequency information $f_{EST}$. In contrast, if the frequency is determined to be synchronous, on and after this point of time, the frequency estimating circuit 4 outputs this frequency information $f_{EST}$ to the D/C oscillator 19. Consequently, the same advantage as the embodiment 18 can be obtained, even if the AFC is to be arranged in a feedback form instead of a feed forward form.

In the frequency estimation in the embodiment 2~embodiment 4, embodiment 7, embodiment 8, embodiment 15 and embodiment 16, two processings are performed, and increasing the number of processings may reduce detection error and allow $\Delta f$ to be estimated at a good accuracy level.

Although in these embodiments, processings are parallel, a single decimating and frequency estimating circuit may be allowed to perform a plurality of processings using buffers if processing time presents no problem. In this way, the decimating and frequency estimating circuit may be of a single arrangement, and its construction is simplified.

Alternative Embodiment 5

The LPF is provided to remove components outside the band of the signal in the embodiment 3, embodiment 6, embodiment 8, embodiment 10, embodiment 14 and embodiment 16, but such an LPF is needless if the aliasing noise and noise within the desired observation range are negligibly low (with an excellent S/N ratio). Such an arrangement simplifies the construction of each of the above embodiments.

Alternative Embodiment 6

In the embodiment 18, the frequency correction process and the determining process are repeated to $f_{EST1}$~$f_{ESTK}$ until a known pattern is detected, and if the distribution of frequency offset $\Delta f$ has any particular feature, the processes may be carried out in the order that is suited to the feature.

For example, the distribution of $\Delta f$ is in the vicinity of 0, the processing may be first performed to frequencies corresponding to $f_{EST}$ close to 0, and then $f_{EST}$ may be selected in the order of farther away from 0 for processing. In this way, the time to search for $\Delta f$ is shortened, and thus the time to establish synchronization is accordingly shortened.

Alternative Embodiment 7

In the embodiment 18, once a known pattern is detected, the remaining candidates are not subjected to the frequency correction process and the determining process. Since there is a possibility of detection error under the influence of noise, the frequency correction process and the determining process may be performed to the remaining candidates even if the known pattern is detected at a frequency.

When the known pattern is found in a single candidate only, the frequency correction block 7, upon receiving the detected signal, fixes a frequency to be corrected, with a frequency corresponding to it, and corrects thereafter with the frequency. If the known pattern is found in a plurality of candidates, the determination of the frequency may be left to the demodulator block at the succeeding stage. In this way, detection error due to noise or the like is prevented, and $\Delta f$ is estimated at an improved accuracy.

Although this embodiment has been described in connection with the AFC circuit into which the embodiment 1 is incorporated, detection error due to noise or the like may be controlled if the frequency estimating circuit in the embodiments 2 through 17 is employed, and $\Delta f$ is equally estimated at an improved accuracy.

As described above, according to the present invention, time-axis to frequency-axis conversion is performed and frequency information is estimated based on a plurality of candidates of $\Delta f$ from the frequencies of the maximum power spectrum, and thus, the frequencies in a conventionally unobservable range (outside the observable range) can be observed, and a wider frequency range is observed with a data quantity remaining unchanged from that in the prior art system.

Frequency estimation is performed in different observation ranges by using a plurality of data streams sampled at different sampling rates, and thus $\Delta f$ in a conventionally observable range is estimated within the observation range with a smaller quantity of data by taking into consideration aliasing in a plurality of frequency information, and furthermore, with aliasing considered, a wider frequency range is observed with the data quantity remaining unchanged from that in the prior system.

Since, in the course of frequency estimation, a time difference is introduced between two data streams to be used in frequency estimation, correlation of noise between the two data streams is small compared with that resulting from the decimation of the same data stream 1, and the influence of noise is reduced, the occurrence of detection error is lessened, and a more accurate Δf is thus estimated.

By allowing the decimating circuit to decimate the input data stream in the frequency estimation, Δf is estimated within the observation range with a smaller quantity of data than that in the prior art system, and further the same advantage as the first invention is obtained-taking into consideration aliasing.

As described above, a plurality of decimating circuits are used to performed frequency estimation in different frequency ranges and aliasing is considered in a plurality of frequency information, and thus f is estimated within the observation range with a smaller quantity of data than that in the prior art system, and further the same advantage as the first invention is obtained taking into consideration aliasing.

Furthermore, as described above, the same advantage as the fourth invention is provided; and, further all data is used to perform afresh frequency estimation and thus a single frequency candidate is obtained. In view of aliasing, the same advantage as the first invention is provided.

Moreover, as described above, the use of the decimating circuit allows rough frequency estimation with a smaller data quantity.

Frequency estimation is performed with a smaller data quantity after the data stream is decimated, all data is afresh subjected to frequency estimation, and thus a high discrimination is performed with a small processing quantity.

Since the frequency detection result from the frequency estimating circuit is frequency interpolated, frequency estimation is preformed at a high accuracy level.

In the AFC circuit that demodulates the received signal, the input data stream, a plurality of estimatere used to determine synchronization, and frequency estimation is performed in a wide range and a highly accurate and reliable synchronization is established.

The invention being thus described, it will be obvious that the same may be varied in many ways. Such variations are not to be regarded as a departure from the spirit and scope of the invention, and all such modifications as would as would be obvious to one skilled in the art are intended to be included within the scope of the following claims.

What is claimed is:

1. A frequency estimating circuit, comprising:
   a frequency detector circuit including a time-axis to frequency-axis converter circuit for converting an input data stream that is obtained by over-sampling a received signal at a symbol rate T times m on a time axis into a power spectrum on a frequency axis, and a MAX search circuit for searching, in an observation frequency range $-f_S/2 \sim f_S/2$ determined by a sampling rate $f_S = m/T$, for a frequency $f_1$ corresponding to a maximum value of the power spectrum, and
   a frequency computing circuit for estimating a plurality of frequency information $f_{EST}$ as a candidate for a frequency offset Δf of a carrier of the received signal through the computation noted below based on the frequency $f_1$ corresponding to the maximum value of the power spectrum determined by said frequency detector circuit and for outputting frequency information $$f_{EST} = f_1 + n \cdot f_S$$

n: an integer that meets $f_L \leq (f_1 + n \cdot f_S) \leq f_U$
$f_L$: lower limit of the distribution range of Δf
$f_U$: upper limit of the distribution range of Δf.

2. The frequency estimating circuit according to claim 1, said frequency detector circuit further including a plurality of the time-axis to frequency-axis converter circuits for converting a plurality of input data streams that are obtained by sampling the received signal at a plurality of different sampling rates into power spectrums on a frequency axis in accordance with the respective input data streams, and a plurality of the MAX search circuits corresponding to the plurality of the time-axis to frequency-axis converter circuits, for determining the frequencies corresponding to the maximum values of the power spectrums converted by the respective time-axis to frequency-axis converter circuits,
   whereby said frequency computing circuit estimates the frequency offset of the carrier of the received signal through computation based on the frequencies determined by the frequency detector circuit and outputs frequency information.

3. The frequency estimating circuit according to claim 2, further comprising:
   a plurality of filter means having transfer functions that allow a signal within the observation frequency range to pass therethrough, whereby the plurality of the time-axis to frequency-axis converter circuits perform time-axis to frequency-axis conversion to the data streams that have passed through the filter means.

4. The frequency estimating circuit according to claim 2, further comprising:
   a time difference circuit for introducing a time difference between the plurality of input data streams that are obtained by sampling the received signal at the plurality of different sampling rates, whereby the time-axis to frequency-axis converter circuits perform time-axis to frequency-axis conversion to the plurality of input data streams after the time difference is introduced by the time difference circuit.

5. The frequency estimating circuit according to claim 1, further comprising:
   a decimating circuit for producing a new data stream by decimating the input data stream at predetermined intervals,
   whereby the time-axis to frequency-axis converter circuit converts the output data stream output by the decimating circuit into a power spectrum on a frequency axis, wherein a decimating and frequency detector circuit is constituted by the decimating circuit, the time-axis to frequency-axis converter circuit, and the MAX search circuit, and said frequency computing circuit estimates the frequency offset of the carrier of the received signal through computation based on the frequency determined by the MAX search circuit in the decimating and frequency detector circuit and outputs frequency information.

6. The frequency estimating circuit according to claim 5, further comprising:
   a plurality of the decimating and frequency detector circuits for performing time-axis to frequency-axis conversion to new data streams that are produced by decimating the input data stream at different intervals in order to determine power spectrums and for determining frequencies corresponding to the maximum values of the power spectrums, whereby said frequency computing circuit estimates the frequency offset of the carrier of the received signal through computation based on the frequencies determined by the decimating and frequency detector circuits and outputs frequency information.

7. The frequency estimating circuit according to claim 1, further comprising:

a decimating and frequency detector circuit comprising a decimating circuit for producing a new data stream by decimating the input data stream at predetermined intervals, a second time-axis to frequency-axis converter circuit for time-axis to frequency-axis converting the new data stream into a power spectrum on a frequency axis, and a second MAX search circuit for searching the maximum value of the power spectrum determined by the second time-axis to frequency-axis converter circuit and determining the frequency corresponding to the maximum value, and a second frequency computing circuit for estimating the frequency offset of the carrier of the received signal through computation based on the frequency determined by the second decimating and frequency detector circuit and for outputting frequency information, whereby the time-axis to frequency-axis converter circuit in the frequency detector circuit performs time-axis to frequency-axis conversion to the input data stream and determines the power spectrum of a frequency corresponding to the frequency information from the second frequency computing circuit.

8. The frequency estimating circuit according to claim 1, further comprising:

a decimating circuit for producing a new data spectrum by extracting data from the input data stream so that a resulting sample count of the new data stream is 1/b (b is a natural number) times the sample count of the input data stream, whereby the time-axis to frequency-axis converter circuit in the frequency detector circuit performs time-axis to frequency-axis conversion to the input data stream produced by the decimating circuit, into a power spectrum on a frequency axis.

9. The frequency estimating circuit according to claim 1, further comprising:

a decimating circuit for producing a new data stream by extracting data from the input data stream so that a resulting sample count of the new data stream is 1/b (b is a natural number) times the sample count of the input data stream, and a second frequency detector circuit including a second time-axis to frequency-axis converter circuit for time-axis to frequency-axis converting the new data stream produced by said decimating circuit into a power spectrum on a frequency axis, and a second MAX search circuit for searching the maximum value of the power spectrum determined by the second time-axis to frequency-axis converter circuit and for determining the frequency corresponding to the maximum value, whereby the time-axis to frequency-axis converter circuit performs time-axis to frequency-axis conversion to the input data stream into a power spectrum on a frequency axis having the frequency in the vicinity of the frequency information determined by the second MAX search circuit in the second frequency detector circuit.

10. The frequency estimating circuit according to claim 7, further comprising:

a plurality of the second decimating and frequency detector circuits which produce new, different data streams by decimating the input data stream at different intervals, time-axis to frequency-axis convert the new, different data streams to determine power spectrums, searching maximum values of the power spectrums and determining frequencies corresponding to the maximum values, whereby the second frequency computing circuit estimates the frequency offset of the carrier through computation based on the frequencies determined by the plurality of the decimating and frequency detector circuits and outputs frequency information.

11. The frequency estimating circuit according to claim 1, wherein the frequency detector circuit further includes a frequency interpolation circuit for interpolating the frequency output by the MAX search circuit.

12. An AFC circuit comprising:

a frequency detector circuit including a time-axis to frequency-axis converter circuit for converting an input data stream that is obtained by over-sampling a received signal at a symbol rate T times m on a time axis into a power spectrum on a frequency axis, and a MAX search circuit for searching, in an observation frequency range $-f_S/2 \sim f_S/2$ determined by a sampling rate $f_S = m/T$, for a frequency $f_1$ corresponding to a maximum value of the power spectrum, a frequency computing circuit for estimating a plurality of frequency information $f_{EST}$ as a candidate for a frequency offset $\Delta f$ of a carrier of the received signal through the computation noted below based on the frequency $f_1$ corresponding to the maximum value of the power spectrum determined by said frequency detector circuit and for outputting frequency information, $$f_{EST} = f_1 + n \cdot f_S$$

n: an integer that meets $f_L \leq (f_1 + n \cdot f_S) \leq f_U$ $f_L$: lower limit of the distribution range of $\Delta f$ $f_U$: upper limit of the distribution range of $\Delta f$, a frequency correction block for producing a plurality of demodulated data streams by removing the frequency offset $\Delta f$ from the received signal based on the plurality of frequency information output from the frequency computing circuit, and a determining circuit for determining frequency synchronization using the plurality of demodulated data streams output from the frequency correction block.

\* \* \* \* \*